United States Patent
Jang et al.

(10) Patent No.: US 10,978,662 B2
(45) Date of Patent: Apr. 13, 2021

(54) QUANTUM DOT LIGHT-EMITTING DIODE AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Christophe Avis, Seoul (KR); Jeong Gi Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 16/571,568

(22) Filed: Sep. 16, 2019

(65) Prior Publication Data
US 2020/0091454 A1    Mar. 19, 2020

(30) Foreign Application Priority Data

Sep. 17, 2018 (KR) .......................... 10-2018-0110935

(51) Int. Cl.
*H01L 51/50* (2006.01)
*H01L 51/56* (2006.01)
*H01L 51/00* (2006.01)

(52) U.S. Cl.
CPC ...... *H01L 51/5088* (2013.01); *H01L 51/0007* (2013.01); *H01L 51/0028* (2013.01); *H01L 51/502* (2013.01); *H01L 51/5056* (2013.01); *H01L 51/5072* (2013.01); *H01L 51/56* (2013.01)

(58) Field of Classification Search
None
See application file for complete search history.

(56) References Cited

U.S. PATENT DOCUMENTS

2007/0102696 A1    5/2007 Brown et al.

FOREIGN PATENT DOCUMENTS

| KR | 10-2012-0009229 A | 2/2012 |
| KR | 10-2012-0010060 A | 2/2012 |
| KR | 10-2016-0030767 A | 3/2016 |

OTHER PUBLICATIONS

Lokhande, A.C. "The versatility of copper tin sulfide" J. Mater. Chem. A, 7, 17118 Apr. 18, 2019 (Year: 2019).*
English machine translation of KR1020120009229 (Year: 2012).*
English machine translation of KR 1020160030767 (Year: 2016).*
English machine translation of KR 1020120010060 (Year: 2012).*

(Continued)

*Primary Examiner* — Grant S Withers
(74) *Attorney, Agent, or Firm* — Sughrue Mion, PLLC

(57) ABSTRACT

Disclosed is a quantum dot light-emitting diode including a positive electrode, a hole injection layer, a hole transport layer, a light-emitting layer, an electron transport layer, and a negative electrode, wherein the hole injection layer is a p-type oxide semiconductor represented by Formula 1 below:

$$Cu_2Sn_{2-X}S_3\text{—}(Ga_X)_2O_3, \quad \text{[Formula 1]}$$

wherein X is greater than 0.2 and less than 1.5 (0.2<x<1.5).

5 Claims, 62 Drawing Sheets

(56) References Cited

OTHER PUBLICATIONS

Berg et al, "Thin film solar cells based on the ternary compound $Cu_2SnS_3$", Thin Solid Films 520, (2012), p. 6291-6294.
Communication dated Feb. 26, 2020, issued by the Korean Patent Office in counterpart Korean Patent Application No. 10-2018-0110935.

* cited by examiner

QUANTUM DOT LIGHT-EMITTING DIODE AND METHOD OF FABRICATING THE SAME

CROSS-REFERENCE TO RELATED APPLICATION

This application claims priority to Korean Patent Application No. 10-2018-0110935, filed on Sep. 17, 2018 in the Korean Intellectual Property Office, the disclosure of which is incorporated herein by reference.

BACKGROUND OF THE DISCLOSURE

Field of the Disclosure

The present disclosure relates to a quantum dot light-emitting diode and a method of fabricating the same, and more particularly, to a quantum dot light-emitting diode using a p-type oxide semiconductor including $Cu_2SnS_3$—$Ga_2O_3$ and a method of fabricating the quantum dot light-emitting diode.

Description of the Related Art

Recently, development of high-performance quantum dot light-emitting diodes has been actively carried out. In implementing a high-performance quantum dot light-emitting diode, hole transport is considered to be a very important process.

In conventional quantum dot light-emitting diodes, a poly(3,4-ethylenedioxythiophene)-poly(styrenesulfonate) (PEDOT:PSS) layer having high conductivity is generally used as a hole injection layer.

However, when PEDOT:PSS is used as a hole injection layer, annealing time is required, resulting in a longer process time. In addition, since PEDOT:PSS is strongly acidic, the surface of an ITO electrode may be damaged, and the stability of a device may be deteriorated.

Therefore, studies are underway to use an oxide semiconductor as the hole injection layer.

Oxide semiconductors are suitable for realizing a transparent display due to high mobility and transparency thereof. In addition, since oxide semiconductors have an amorphous or polycrystalline structure at room temperature, a separate heat treatment process for forming grains is unnecessary. Thus, oxide semiconductors exhibit excellent properties when applied to a quantum dot light-emitting diode.

In addition, oxide semiconductors are direct semiconductors having high mobility (1 to 100 $cm^2/Vs$) and high band gaps. Unlike silicon-based devices, since there is no oxidation phenomenon in oxide semiconductors, oxide semiconductors have an advantage of less variation in device characteristics.

However, oxide semiconductors generally exhibit n-type characteristics due to oxygen vacancies and zinc interstitials. Thus, it is difficult to perform p-type doping in oxide semiconductors.

As described above, most oxide semiconductors known to date exhibit n-type characteristics. When a transparent semiconductor having p-type characteristics is implemented, the transparent oxide semiconductor may be advantageously used as the hole injection layer of a quantum dot light-emitting diode. Therefore, it is necessary to develop a p-type transparent oxide semiconductor through optimization of doping conditions or development of new materials.

RELATED DOCUMENTS

Patent Documents

Korean Patent Application Publication No. 10-2016-0030767, "ORGANIC LIGHT-EMITTING DIODE USING P-TYPE OXIDE SEMICONDUCTOR INCLUDING GALLIUM AND METHOD OF PREPARING THE ORGANIC LIGHT-EMITTING DIODE"

Korean Patent Application Publication No. 10-2012-0009229, "THIN FILM TRANSISTOR AND METHOD OF PREPARING THE SAME"

Non-Patent Documents

Dominik M. Berg et al., "Thin film solar cells based on the ternary compound $Cu_2SnS_3$," (May 31, 2012)

SUMMARY OF THE DISCLOSURE

Therefore, the present disclosure has been made in view of the above problems, and it is an object of the present disclosure to provide a high-efficiency quantum dot light-emitting diode in which a p-type oxide semiconductor including $Cu_2SnS_3$—$Ga_2O_3$ is used as a hole injection layer.

It is another object of the present disclosure to provide a quantum dot light-emitting diode in which a p-type oxide semiconductor fabricated using a solution process is used. According to the present disclosure, since a p-type oxide semiconductor fabricated using a solution process is used, the quantum dot light-emitting diode is applicable to a low-temperature process, thereby reducing preparation costs.

In accordance with one aspect of the present disclosure, provided is quantum dot light-emitting diode including a positive electrode, a hole injection layer, a hole transport layer, a light-emitting layer, an electron transport layer, and a negative electrode, wherein the hole injection layer is a p-type oxide semiconductor represented by Formula 1 below:

$$Cu_2Sn_{2-X}S_3\text{—}(Ga_X)_2O_3, \qquad\qquad [\text{Formula 1}]$$

wherein X is greater than 0.2 and less than 1.5 (0.2<x<1.5).

The p-type oxide semiconductor may be heat-treated or treated with ultraviolet light/ozone.

The heat treatment may be performed at 150 to 250° C.

The heat treatment may be performed for 10 to 90 minutes.

The ultraviolet light/ozone treatment may be performed for 0 to 5 minutes.

In accordance with another aspect of the present disclosure, provided is a method of fabricating a quantum dot light-emitting diode including a step of forming a positive electrode on a substrate; a step of forming a hole injection layer on the positive electrode; a step of forming a hole transport layer on the hole injection layer; a step of forming a light-emitting layer on the hole transport layer; a step of forming an electron transport layer on the light-emitting layer; and a step of forming a negative electrode on the electron transport layer, wherein the hole injection layer is formed by forming a film using a solution prepared by mixing a p-type oxide semiconductor represented by Formula 1 below and a solvent:

$$Cu_2Sn_{2-X}S_3-(Ga_X)_2O_3,\quad\text{[Formula 1]}$$

wherein X is greater than 0.2 and less than 1.5 (0.2<x<1.5).

The p-type oxide semiconductor may include a step of preparing a precursor solution containing Cu, S, M, and Ga, wherein M includes one or more compounds selected from SnO, ITO, IZTO, IGZO, and IZO; a step of forming a coating layer by applying the precursor solution onto the substrate; and a step of heat-treating the coating layer.

The solvent may be prepared by mixing 2-methoxyethanol, ethylene glycol, and 5 to 50 volume percent of at least one of acetonitrile, DI water, an alcohol, cyclohexane, toluene, and a quantum dot solvent.

The p-type oxide semiconductor may be heat-treated or treated with ultraviolet light/ozone.

The heat treatment may be performed at 150 to 250° C.

The heat treatment may be performed for 10 to 90 minutes.

The ultraviolet light/ozone treatment may be performed for 0 to 5 minutes.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
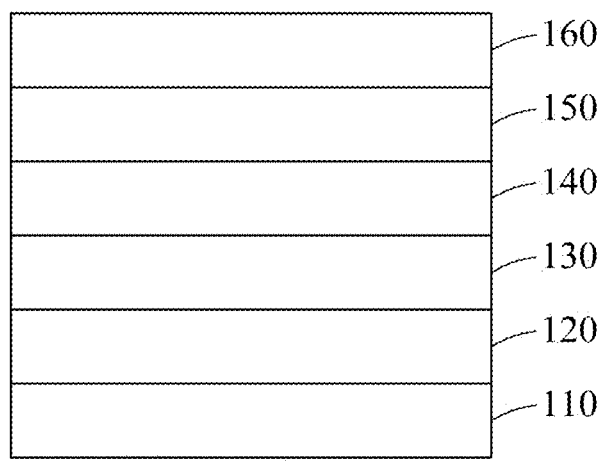
FIG. 1 is a cross-sectional view of a quantum dot light-emitting diode according to one embodiment of the present disclosure.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Hereinafter, a quantum dot light-emitting diode according to one embodiment of the present disclosure will be described with reference to FIG. 1.

FIG. 1 is a cross-sectional view of a quantum dot light-emitting diode according to one embodiment of the present disclosure.

The quantum dot light-emitting diode according to one embodiment of the present disclosure may include a positive electrode 110, a hole injection layer 120, a hole transport layer 130, a light-emitting layer 140, an electron transport layer 150, and a negative electrode 160.

Referring to FIG. 1, in the quantum dot light-emitting diode according to one embodiment of the present disclosure, the positive electrode 110 is formed on a substrate (not shown).

The substrate is a base substrate for forming a quantum dot light-emitting diode. Substrates generally used in the art to which the present disclosure pertains may be used as the substrate of the present disclosure. In addition, the material of the substrate is not particularly limited, and may include silicon, glass, plastic, metal foil, and the like.

For example, the plastic substrate may include polyethylene terephthalate (PET), polyethylenenaphthelate (PEN), polypropylene (PP), polycarbonate (PC), polyimide (PI), tri acetyl cellulose (TAC), and polyethersulfone (PES), and a flexible substrate such as an aluminum foil or a stainlesssteel foil may be used.

The positive electrode 110 is an electrode for providing holes to a device, and may be formed by performing a solution process such as screen printing on a transmissive electrode, a reflective electrode, a metal paste, or a metal ink material in a colloid state in a predetermined liquid.

The transmissive electrode material may include at least one of indium tin oxide (ITO), indium zinc oxide (IZO), tin oxide ($SnO_2$), zinc oxide (ZnO), multilayer metal oxide/metal/metal oxide, graphene, and carbon nanotube, which are transparent and have excellent conductivity.

The reflective electrode material may include at least one of magnesium (Mg), aluminum (Al), silver (Ag), Ag/ITO, Ag/IZO, aluminum-lithium (Al—Li), calcium (Ca), magnesium-indium (Mg—In), and magnesium-silver (Mg—Ag).

The metal paste may include any one of silver paste (Ag paste), aluminum paste (Al paste), gold paste (Au paste), and copper paste (Cu paste), or may be in the form of an alloy.

The metal ink material may include at least one of silver (Ag) ink, aluminum (Al) ink, gold (Au) ink, calcium (Ca)

ink, magnesium (Mg) ink, lithium (Li) ink, and cesium (Cs) ink, and the metal material contained in the metal ink material may be ionized in the solution.

The positive electrode 110 may be formed on the substrate by a conventional vacuum deposition process (e.g., chemical vapor deposition, CVD) or an application method in which printing is performed using paste metal ink prepared by mixing metal flakes or metal particles and a binder, and any method capable of forming an electrode may be used without being limited to the above methods.

The hole injection layer 120 serves to transfer holes injected from the positive electrode 110 to the hole transport layer 130, and is formed between the hole transport layer 130 and the positive electrode 110.

The hole injection layer 120 may be formed using a solution process. Specifically, the hole injection layer 120 may be formed using any one solution process selected from spin coating, slit dye coating, ink-jet printing, spray coating, and dip coating.

Preferably, the hole injection layer 120 may be formed using spin coating. In spin coating, a certain amount of a solution is dropped onto a substrate while rotating the substrate at high speed. At this time, coating is performed by centrifugal force applied to the solution.

Since the hole injection layer 120 is formed using the solution process, a large area process may be performed, process time may be shortened, and limitations on the semiconductor characteristics of the upper and lower electrodes (positive and negative electrodes) may be reduced.

The hole injection layer 120 may be formed by forming a film using a solution prepared by mixing a p-type oxide semiconductor represented by Formula 1 below instead of commonly used PEDOT:PSS and a solvent.

$$Cu_2Sn_{2-X}S_3\text{---}(Ga_X)_2O_3, \quad \text{[Formula 1]}$$

wherein X is greater than 0.2 and less than 1.5 (0.2<x<1.5).

When the p-type oxide semiconductor is formed, a precursor solution containing Cu, S, M, and Ga may be prepared (here, M includes one or more compounds selected from SnO, ITO, IZTO, IGZO, and IZO), a coating layer may be formed by applying the precursor solution onto the substrate on which the positive electrode is formed, and then the coating layer may be heat-treated.

The p-type oxide semiconductor may be heat-treated or treated with ultraviolet light/ozone.

The heat treatment may be performed at 150 to 250° C. for 10 to 60 minutes.

The ultraviolet light/ozone treatment may be performed for 0 to 5 minutes.

The solvent may be prepared by mixing ethylene glycol and 5 to 50 volume percent of at least one of 2-methoxyethanol, acetonitrile, DI water, an alcohol, cyclohexane, toluene, and an organic solvent.

The hole transport layer 130 serves to transfer holes injected from the hole injection layer 120 to the light-emitting layer 140, and is formed between the hole injection layer 120 and the light-emitting layer 140.

The hole transport layer 130 may be formed by a vacuum deposition process using an organic material.

Specifically, the hole transport layer 130 may be formed by at least one process of chemical vapor deposition, physical vapor deposition, atomic layer deposition, metal organic chemical vapor deposition, plasma-enhanced chemical vapor deposition, molecular beam epitaxy, hydride vapor phase epitaxy, and sputtering. However, the present disclosure is not limited thereto, and other known methods may be used.

In the light-emitting layer 140, holes injected from the positive electrode 110 and passed through the hole transport layer and electrons injected from the negative electrode 160 and passed through the electron transport layer are recombined to generate excitons, and light is emitted when the generated excitons change from an excited state to a ground state. In this case, the light-emitting layer 140 may be a single-layer or multilayer form.

The light-emitting layer 140 may be formed by at least one process of sputtering, spin coating, slit dye coating, ink-jet printing, spray coating, dip coating, vacuum deposition, chemical vapor deposition, physical vapor deposition, atomic layer deposition, metal organic chemical vapor deposition, plasma-enhanced chemical vapor deposition, molecular beam epitaxy, and hydride vapor phase epitaxy. However, the present disclosure is not limited thereto, and other known methods may be used.

The electron transport layer 150 serves to transfer electrons injected from the negative electrode 160 to the light-emitting layer, and is formed between the light-emitting layer 140 and the negative electrode 160.

The electron transport layer 150 may be formed by at least one process of sputtering, spin coating, slit dye coating, ink-jet printing, spray coating, dip coating, vacuum deposition, chemical vapor deposition, physical vapor deposition, atomic layer deposition, metal organic chemical vapor deposition, plasma-enhanced chemical vapor deposition, molecular beam epitaxy, and hydride vapor phase epitaxy. However, the present disclosure is not limited thereto, and other known methods may be used.

The negative electrode 160 is an electrode for providing electrons to a device, and may be formed by performing a solution process such as screen printing on a transmissive electrode, a reflective electrode, a metal paste, or a metal ink material in a colloid state in a predetermined liquid.

The transmissive electrode material may include at least one of indium tin oxide (ITO), indium zinc oxide (IZO), tin oxide ($SnO_2$), zinc oxide (ZnO), multilayer metal oxide/metal/metal oxide, graphene, and carbon nanotube, which are transparent and have excellent conductivity.

The reflective electrode material may include at least one of magnesium (Mg), aluminum (Al), silver (Ag), Ag/ITO, Ag/IZO, aluminum-lithium (Al—Li), calcium (Ca), magnesium-indium (Mg—In), and magnesium-silver (Mg—Ag).

The metal paste may include any one of silver paste (Ag paste), aluminum paste (Al paste), gold paste (Au paste), and copper paste (Cu paste), or may be in the form of an alloy.

The metal ink material may include at least one of silver (Ag) ink, aluminum (Al) ink, gold (Au) ink, calcium (Ca) ink, magnesium (Mg) ink, lithium (Li) ink, and cesium (Cs) ink, and the metal material contained in the metal ink material may be ionized in the solution.

The negative electrode 160 may be formed on the substrate by a conventional vacuum deposition process (e.g., chemical vapor deposition, CVD) or an application method in which printing is performed using paste metal ink prepared by mixing metal flakes or metal particles and a binder, and any method capable of forming an electrode may be used without being limited to the above methods.

In the quantum dot light-emitting diode according to an embodiment of the present disclosure, a p-type oxide semiconductor containing $Cu_2SnS_3$—$Ga_2O_3$ having high hole mobility and a high work function is used as a hole injection layer. Thus, the electrical properties of the quantum dot light-emitting diode may be improved.

Hereinafter, the characteristics of quantum dot light-emitting diodes according to embodiments of the present disclosure will be described with reference to FIGS. 2A to 15B.

Examples

Preparation of $Cu_2SnS_3$—$Ga_2O_3$ Solutions

Copper (II) acetate monohydrate, tin (II) chloride, thiourea, and gallium (III) nitrate hydrate were added to 5 mL of a 2-methoxyethanol solvent and stirred at 60° C. for 6 hours to prepare $Cu_2SnS_3$—$Ga_2O_3$ solutions.

The $Cu_2SnS_3$—$Ga_2O_3$ solutions having various molar ratios of Sn to Ga were prepared, and the composition ratios of Cu, Sn, S, and Ga precursors contained in the $Cu_2SnS_3$—$Ga_2O_3$ solutions are shown in Table 1 below.

TABLE 1

| | 0.1M $Cu_2SnS_3$—$Ga_2O_3$ in 2-methoxyethanol (5 ml) | | | |
|---|---|---|---|---|
| Cu:Sn:S:Ga | 1:1.8:1:0.2 | 1:1.5::1:0.5 | 1:1:1:1 | 1:0.5:1:1.5 |
| Copper (II) acetate monohydrate | 100 mg (0.1M) | 100 mg (0.1M) | 100 mg (0.1M) | 100 mg (0.1M) |
| Tin (II) chloride | 171 mg (0.18M) | 143 mg (0.15M) | 95 mg (0.1M) | 48 mg (0.5M) |
| Thiourea | 38 mg (0.1M) | 38 mg (0.1M) | 38 mg (0.1M) | 38 mg (0.1M) |
| Gallium (III) nitrate hydrate | 26 mg (0.02M) | 64 mg (0.05M) | 128 mg (0.1M) | 192 mg (0.15M) |

Fabrication of Quantum Dot Light-Emitting Diode

An ITO substrate having a sheet resistance of 9 $\Omega sq^{-2}$ was subjected to ultrasonic treatment for 15 minutes in acetone, methanol, and isopropanol, respectively, followed by ultraviolet light/ozone treatment for 15 minutes.

Thereafter, spin coating was performed to coat the ITO substrate with $Cu_2SnS_3$—$Ga_2O_3$, and the ITO substrate was treated with ultraviolet light/ozone (main wavelengths 185 and 254 nm) at 100° C. for 2 minutes. Then, the substrate was heat-treated under a nitrogen atmosphere to form a 30 nm hole injection layer.

A quantum dot light-emitting diode was fabricated by sequentially depositing PVK (15 nm) as a hole transport layer, green quantum dots as a light-emitting layer, LZO (70 nm) as an electron transport layer, and Al (100 nm) as a negative electrode on the hole injection layer.

In FIGS. 2A to 2K, the optical properties of a $Cu_2SnS_3$—$Ga_2O_3$ thin film according to one embodiment of the present disclosure are shown.

Figure 2A:
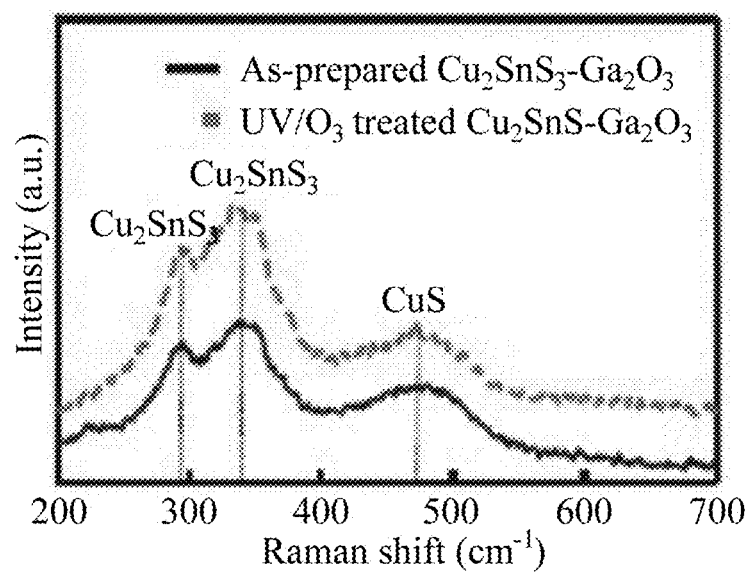
FIG. 2A is a graph showing Raman spectra for an untreated $Cu_2SnS_3$—$Ga_2O_3$ thin film (black line) and an ultraviolet light/ozone-treated $Cu_2SnS_3$—$Ga_2O_3$ thin film (gray line)

FIG. 2A is a graph showing Raman spectra for an untreated $Cu_2SnS_3$—$Ga_2O_3$ thin film (black line) and an ultraviolet light/ozone-treated $Cu_2SnS_3$—$Ga_2O_3$ thin film (gray line).

Referring to FIG. 2A, Raman peaks are observed at 297 $cm^{-1}$, 338 $cm^{-1}$, and 475 $cm^{-1}$, respectively.

$Cu_2SnS_3$ is known to have Raman peaks at 297 $cm^{-1}$ and 338 $cm^{-1}$. When a CuS phase is present in the $Cu_2SnS_3$—$Ga_2O_3$ thin film, Raman peaks are also observed at 475 $cm^{-1}$. Accordingly, based on Raman peak patterns, it can be confirmed that $Cu_2SnS_3$ is contained in the thin film.

When a thin film is treated with ultraviolet light/ozone, the atomic structure of a metal oxide and the composition of local electrons may be changed.

Both untreated $Cu_2SnS_3$—$Ga_2O_3$ thin films and ultraviolet light/ozone-treated $Cu_2SnS_3$—$Ga_2O_3$ thin films have Raman peaks at 297 $cm^{-1}$, 338 $cm^{-1}$, and 475 $cm^{-1}$. These results indicate that there is no change in the oxidation state of the $Cu_2SnS_3$—$Ga_2O_3$ thin film due to ultraviolet light/ozone treatment.

Figure 2B:
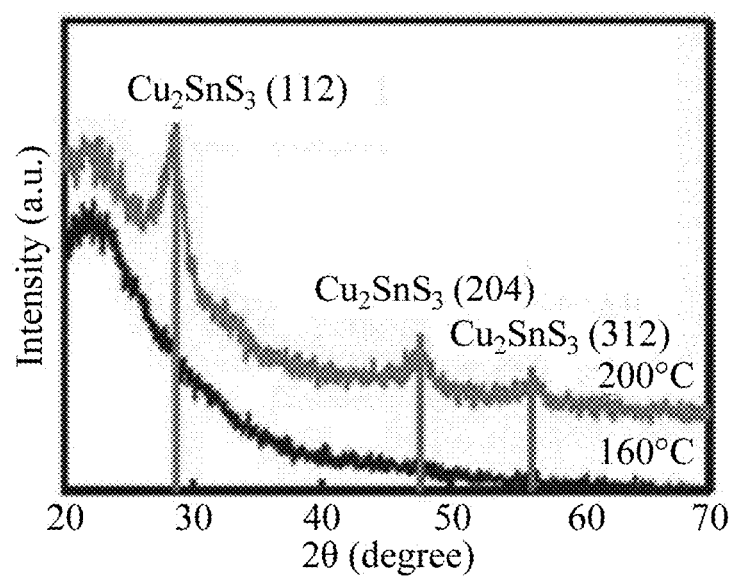
FIG. 2B is a graph showing the X-ray diffraction (XRD) patterns of $Cu_2SnS_3$—$Ga_2O_3$ thin films heat-treated at 160° C. (black) and 200° C. (gray), respectively.

FIG. 2B is a graph showing the X-ray diffraction (XRD) patterns of $Cu_2SnS_3$—$Ga_2O_3$ thin films heat-treated at 160° C. (black) and 200° C. (gray), respectively.

Referring to FIG. 2B, it can be seen that the $Cu_2SnS_3$—$Ga_2O_3$ thin film heat-treated at 160° C. exhibits an amorphous phase, and the $Cu_2SnS_3$—$Ga_2O_3$ thin film heat-treated at 200° C. exhibits peaks at 28.80, 47.6°, and 55.9° due to the (112), (204), and (312) crystal faces of $Cu_2SnS_3$.

From these results, it can be seen that the $Cu_2SnS_3$—$Ga_2O_3$ thin film heat-treated at 200° C. is composed of two phases of crystalline $Cu_2SnS_3$ and amorphous $Ga_2O_3$.

Figure 2C:
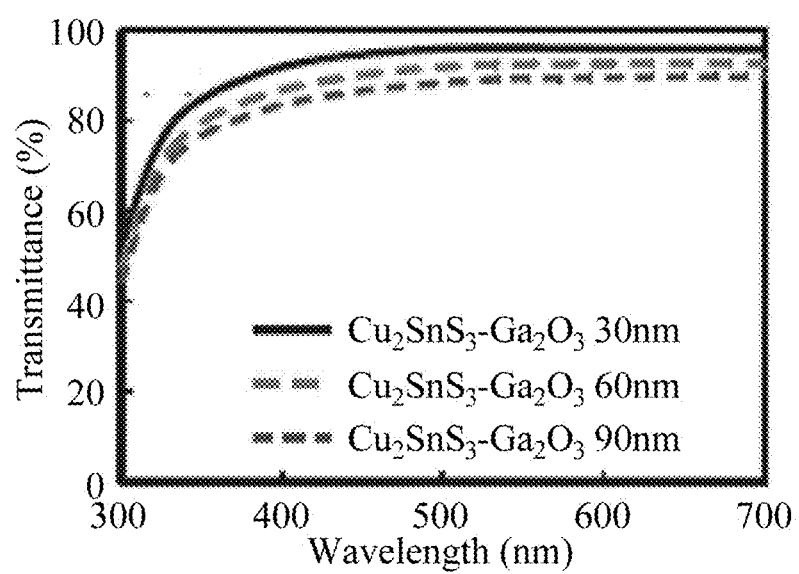
FIG. 2C is a graph showing the light transmittance of a $Cu_2SnS_3$—$Ga_2O_3$ thin film depending on thickness.
Figure 2D:
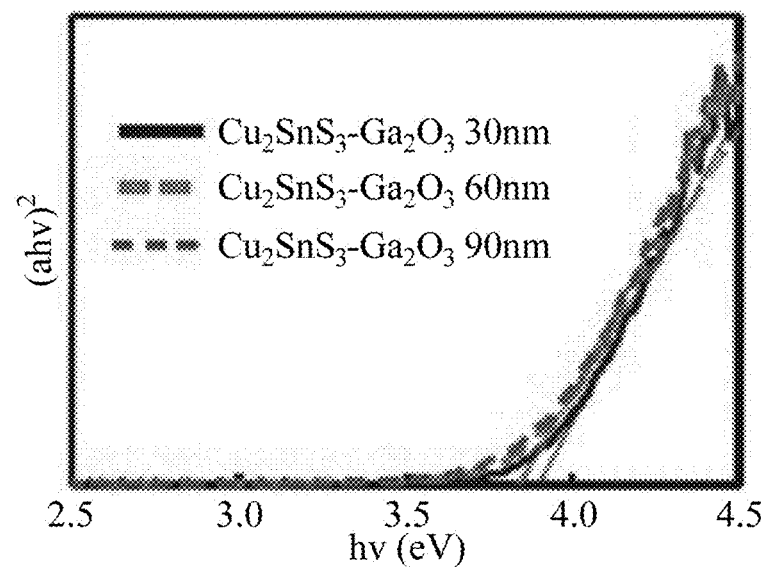
FIG. 2D shows Tauc plots for measuring band gaps.

FIG. 2C is a graph showing the light transmittance of a $Cu_2SnS_3$—$Ga_2O_3$ thin film depending on thickness, and FIG. 2D shows Tauc plots for measuring band gaps.

Referring to FIG. 2C, it can be seen that, as the thickness of the $Cu_2SnS_3$—$Ga_2O_3$ thin film is increased from 30 nm (black) to 90 nm (bottom dashed line), the transmittance at 550 nm is reduced from 96.1% to 89.3%.

Transmittance may be reduced due to defects in band gaps or increase in surface roughness with increasing thickness, and the surface roughness is related to transmittance due to diffused light.

Referring to FIG. 2D, it can be seen that the Tauc plots of $(ahv)^2$–photon energy (hv) for $Cu_2SnS_3$—$Ga_2O_3$ thin films depending on thickness exhibit 3.84 eV to 3.86 eV.

Figure 2E:
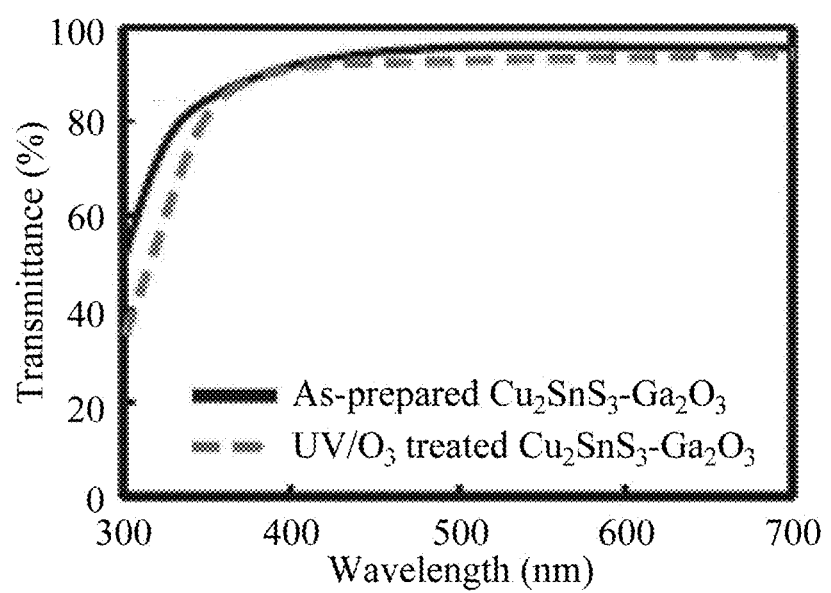
FIG. 2E is a graph showing the light transmittance of a $Cu_2SnS_3$—$Ga_2O_3$ thin film depending on the presence or absence of ultraviolet light/ozone treatment.
Figure 2F:
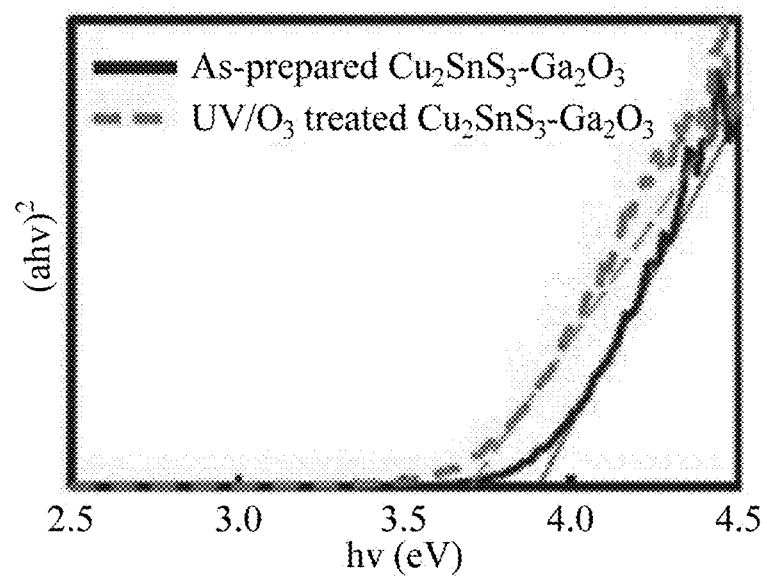
FIG. 2F shows Tauc plots for measuring band gaps.

FIG. 2E is a graph showing the light transmittance of a $Cu_2SnS_3$—$Ga_2O_3$ thin film depending on the presence or absence of ultraviolet light/ozone treatment, and FIG. 2F shows Tauc plots for measuring band gaps.

Referring to FIG. 2E, it can be seen that the light transmittances of the untreated $Cu_2SnS_3$—$Ga_2O_3$ thin film (black line) and the ultraviolet light/ozone-treated $Cu_2SnS_3$—$Ga_2O_3$ thin film (gray line) are more than 90% in the visible light region.

Referring to FIG. 2F, the band gap of the ultraviolet light/ozone-treated $Cu_2SnS_3$—$Ga_2O_3$ thin film (gray line) is 3.70 eVdl, and the band gap of the untreated Cu2SnS3-Ga2O3 thin film (black line) is 3.86 eV. From these results, it can be confirmed that the band gap of the ultraviolet light/ozone-treated $Cu_2SnS_3$—$Ga_2O_3$ thin film is lower than that of the untreated Cu2SnS3-Ga2O3 thin film.

Reduction of a band gap by ultraviolet light/ozone treatment is related to reduction of transmittance in the UV region. When ultraviolet light/ozone treatment is performed, particle size may be increased, thereby reducing a band gap.

Figure 2G:
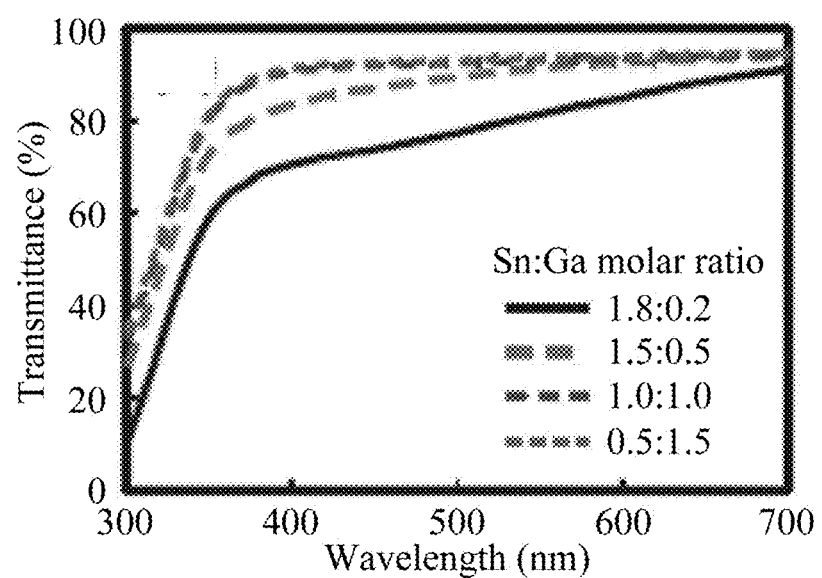
FIG. 2G is a graph showing the light transmittances of $Cu_2SnS_3$—$Ga_2O_3$ thin films having molar ratios of Sn to Ga (Sn:Ga) of 1.8:0.2, 1.5:0.5, 1.0:1.0, and 0.5:1.5, respectively.
Figure 2H:
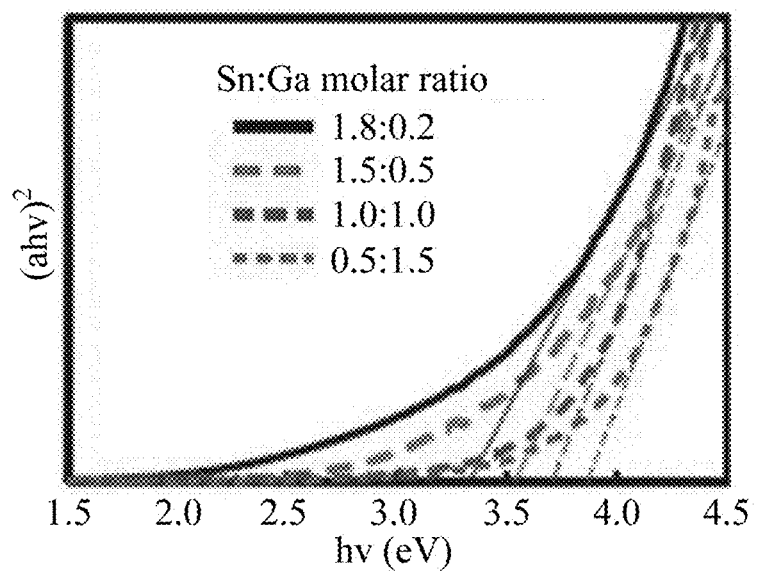
FIG. 2H shows Tauc plots for measuring band gaps.

FIG. 2G is a graph showing the light transmittances of $Cu_2SnS_3$—$Ga_2O_3$ thin films having molar ratios of Sn to Ga (Sn:Ga) of 1.8:0.2, 1.5:0.5, 1.0:1.0, and 0.5:1.5, respectively, and FIG. 2H shows Tauc plots for measuring band gaps.

Referring to FIG. 2G, it can be seen that the $Cu_2SnS_3$—$Ga_2O_3$ thin films having molar ratios of Sn to Ga (Sn:Ga) of 1.5:0.5, 1.0:1.0, and 0.5:1.5, respectively, exhibit a light transmittance of 85% or more in the visible light region, and the $Cu_2SnS_3$—$Ga_2O_3$ thin film having a molar ratio of Sn to Ga (Sn:Ga) of 1.8:0.2 exhibits a relatively low light transmittance.

Referring to FIG. 2H, it can be seen that the $Cu_2SnS_3$—$Ga_2O_3$ thin films having molar ratios of Sn to Ga (Sn:Ga) of 1.8:0.2, 1.5:0.5, 1.0:1.0, and 0.5:1.5, respectively, have band gaps of 3.23 eV, 3.53 eV, 3.70 eV, and 3.86 eV, respectively.

Figure 2I:
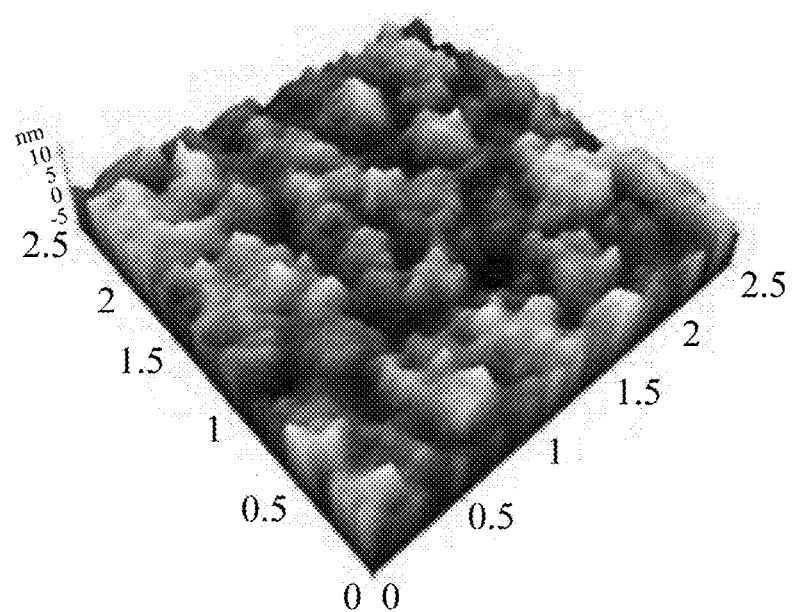
FIG. 2I is an atomic force microscope (AFM) image of a $Cu_2SnS_3$—$Ga_2O_3$ thin film.
Figure 2J:
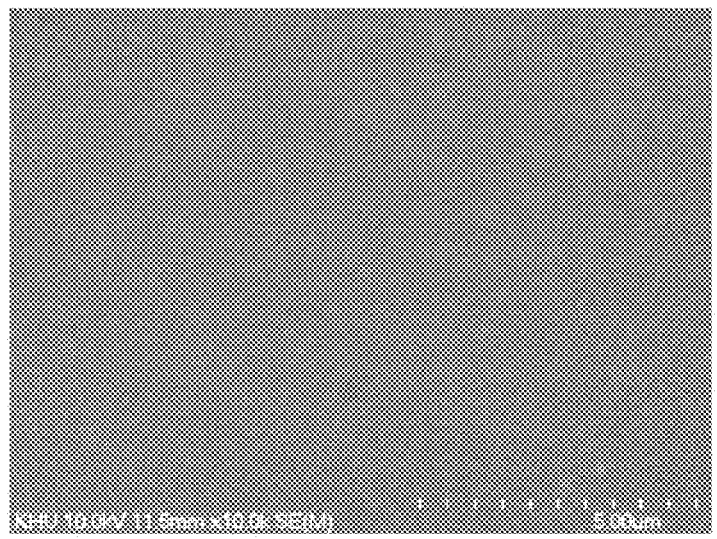
FIG. 2J is a scanning electron microscope (SEM) image of a $Cu_2SnS_3$—$Ga_2O_3$ thin film.
Figure 2K:
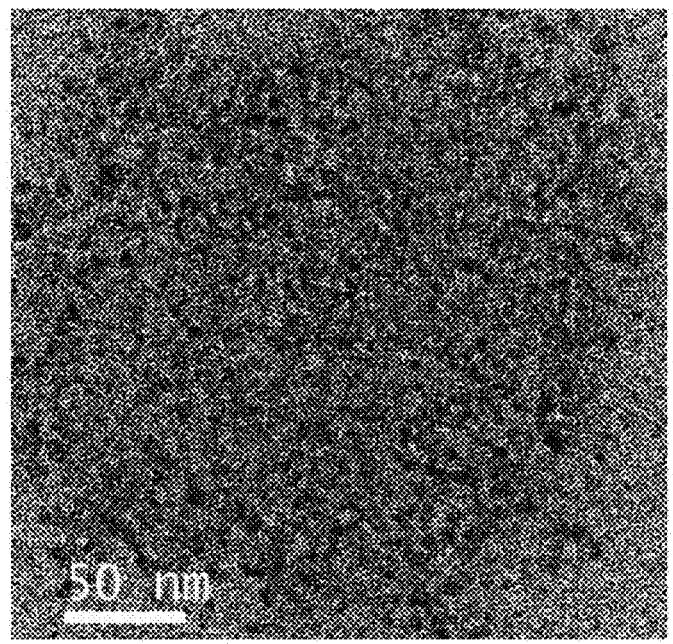
FIG. 2K is a high-resolution transmission electron microscope (HRTEM) image of a $Cu_2SnS_3$—$Ga_2O_3$ thin film.
Figure 2L:
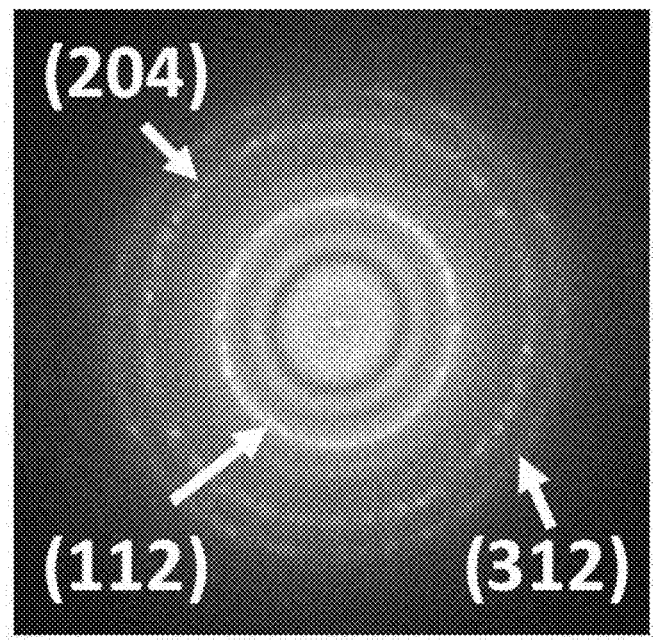
FIG. 2L shows a crystal structure of a selected region obtained by electron diffraction.

FIG. 2I is an atomic force microscope (AFM) image of a $Cu_2SnS_3$—$Ga_2O_3$ thin film, FIG. 2J is a scanning electron microscope (SEM) image of a $Cu_2SnS_3$—$Ga_2O_3$ thin film, FIG. 2K is a high-resolution transmission electron microscope (HRTEM) image of a $Cu_2SnS_3$—$Ga_2O_3$ thin film, and FIG. 2L shows a crystal structure of a selected region obtained by electron diffraction.

Referring to FIGS. 2I to 2L, it can be seen that the $Cu_2SnS_3$—$Ga_2O_3$ thin film is composed of two phases of crystalline $Cu_2SnS_3$ and amorphous $Ga_2O_3$.

Figure 3A:
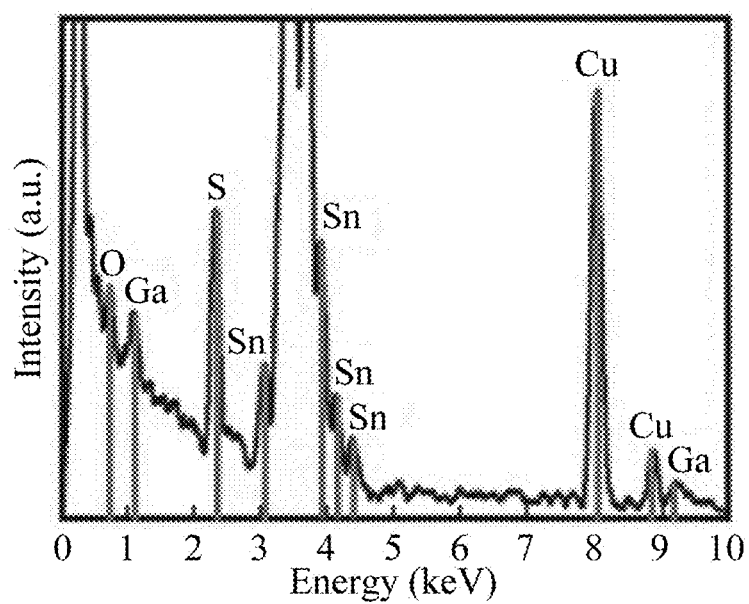
FIG. 3A shows energy-dispersive spectrometer (EDX) spectra for analyzing the chemical composition of a $Cu_2SnS_3$—$Ga_2O_3$ thin film according to an embodiment of the present disclosure.

FIG. 3A shows energy-dispersive spectrometer (EDX) spectra for analyzing the chemical composition of a $Cu_2SnS_3$—$Ga_2O_3$ thin film according to an embodiment of the present disclosure.

Referring to FIG. 3A, it can be seen that Cu, Sn, S, Ga, and O are contained in the $Cu_2SnS_3$—$Ga_2O_3$ thin film.

FIGS. 3B to 3F are graphs showing the results of X-ray photoelectron spectroscopy (XPS) analysis for analyzing the chemical composition of the surface of a $Cu_2SnS_3$—$Ga_2O_3$ thin film treated with ultraviolet light/ozone for 2 minutes and heat-treated at 200° C.

From these results, it can be seen that $Ga_2O_3$ is contained in the $Cu_2SnS_3$—$Ga_2O_3$ thin film.

Figure 3B:
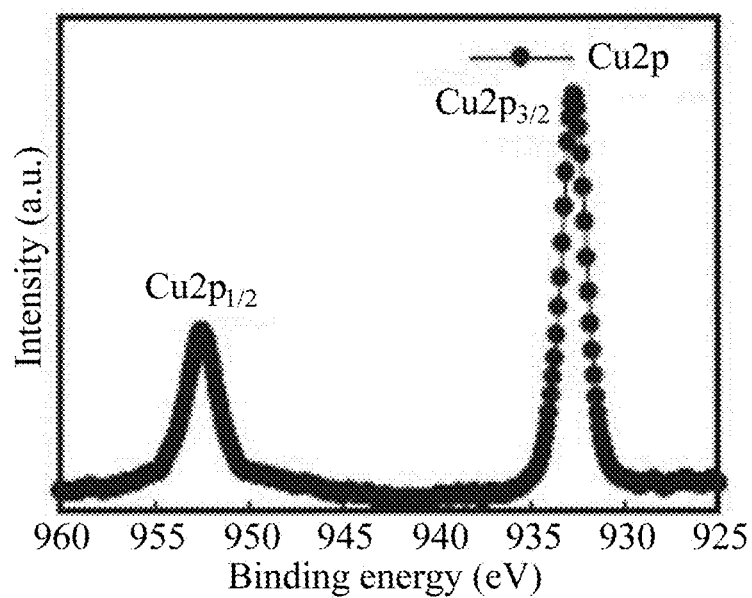
FIGS. 3B to 3F are graphs showing the results of X-ray photoelectron spectroscopy (XPS) analysis for analyzing the chemical composition of the surface of a $Cu_2SnS_3$—$Ga_2O_3$ thin film treated with ultraviolet light/ozone for 2 minutes and heat-treated at 200° C.
Figure 3C:
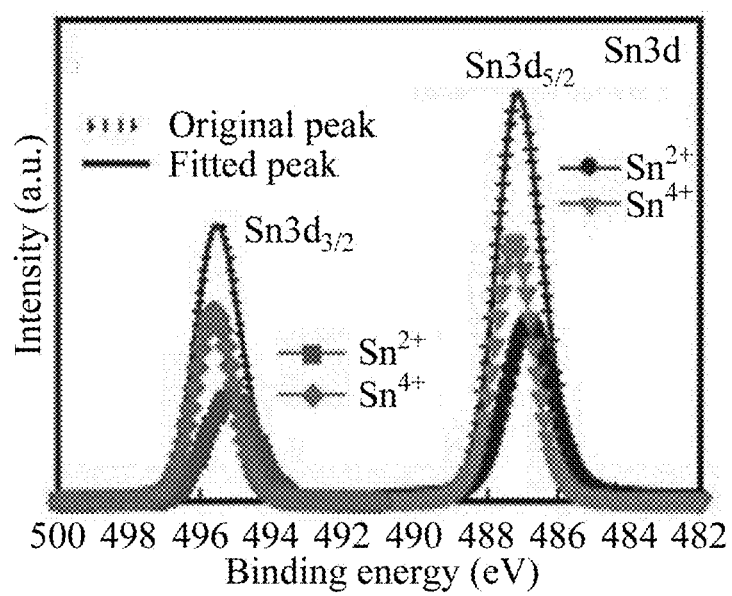
Figure 3D:
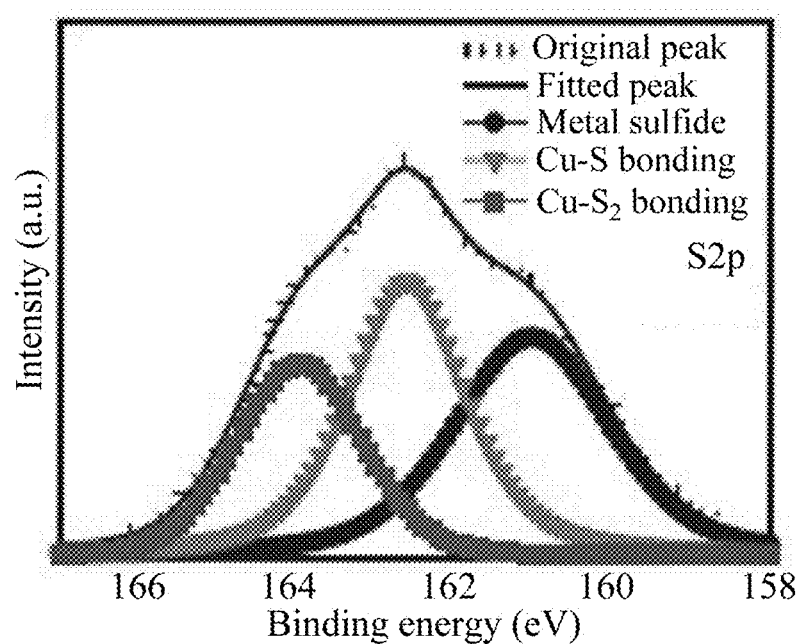
Figure 3E:
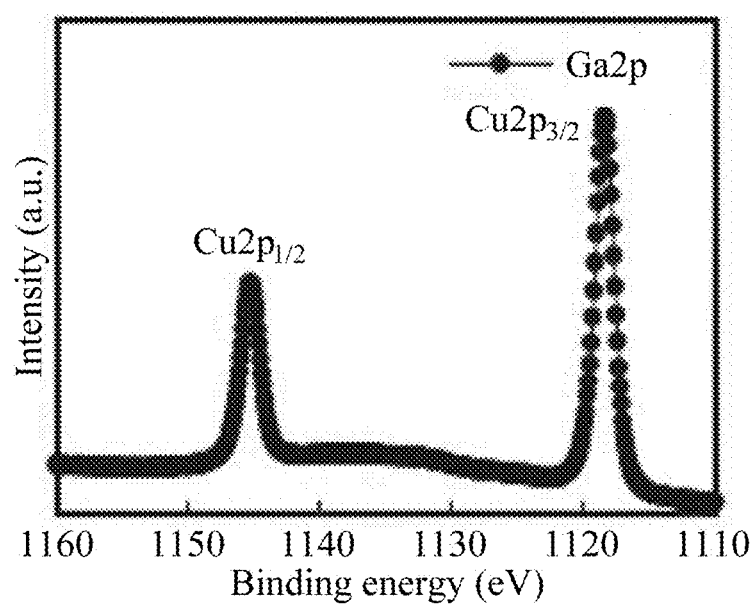
Figure 3F:
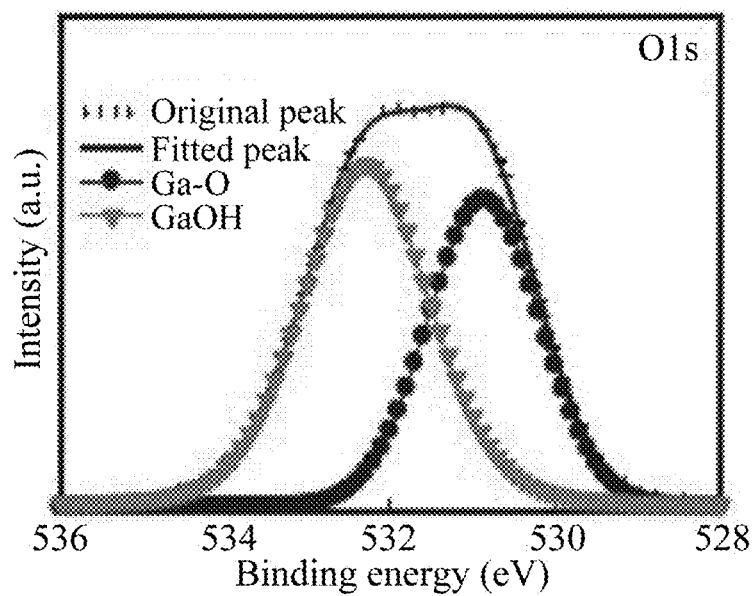

Referring to FIG. 3F, in the O 1s spectrum, two compositions corresponding to Ga—O (531.0 eV) and Ga—OH (532.4 eV), respectively, are observed, indicating that $Ga_2O_3$ is present.

Figure 4A:
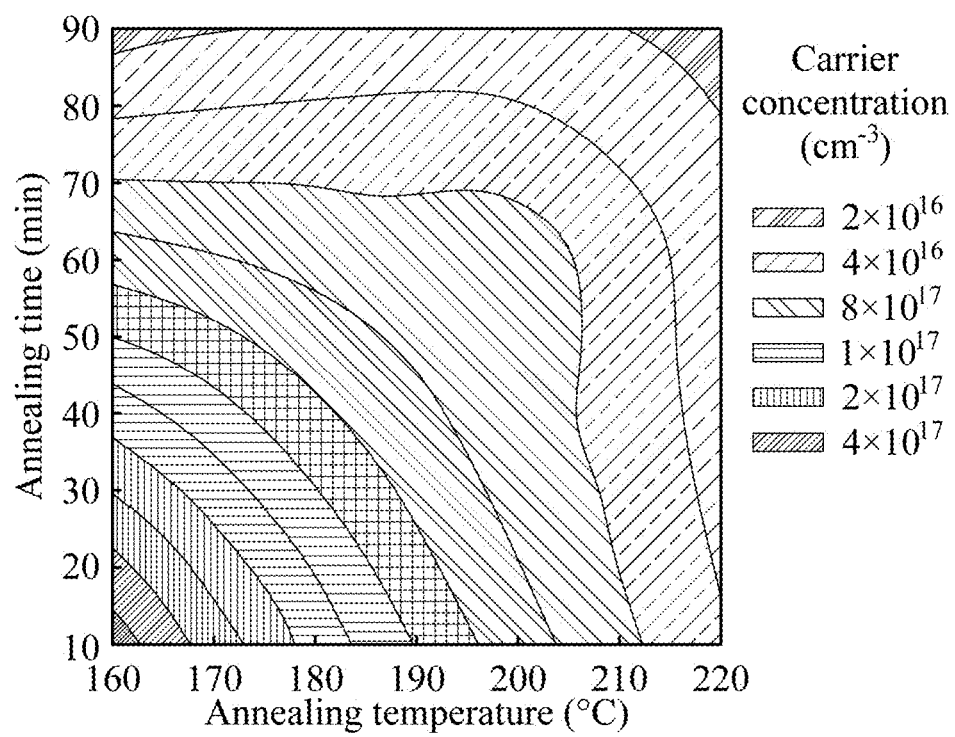
FIGS. 4A to 4C are contour plots for carrier concentration, Hall mobility, and resistivity depending on heat treatment temperature and heat treatment time in a $Cu_2SnS_3$—$Ga_2O_3$ thin film treated with ultraviolet light/ozone for 2 minutes according to an embodiment of the present disclosure.
Figure 4B:
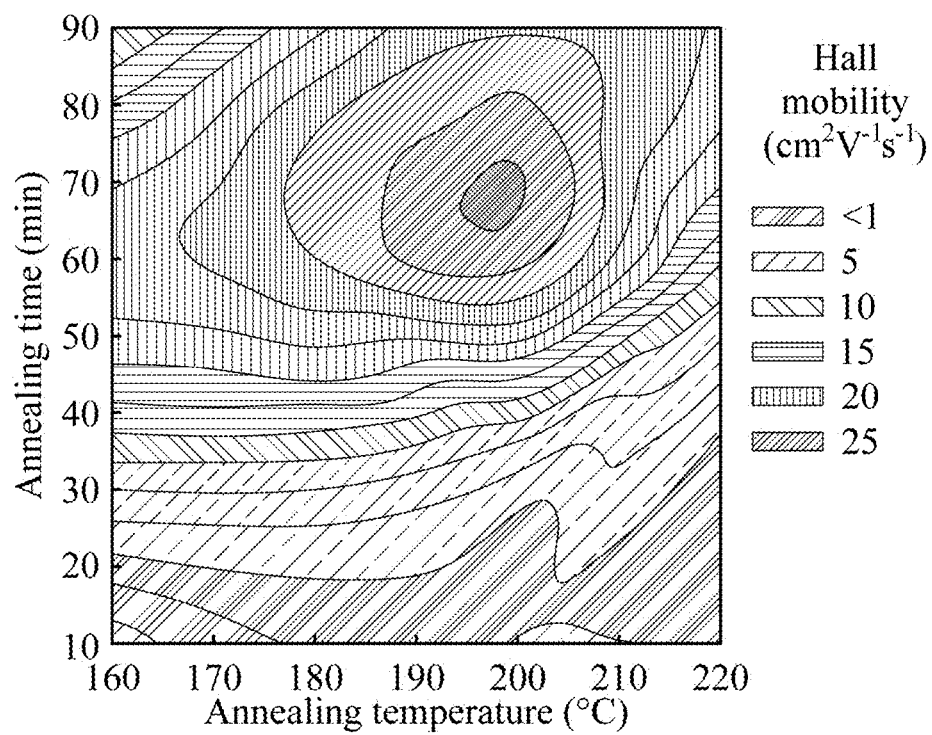
Figure 4C:
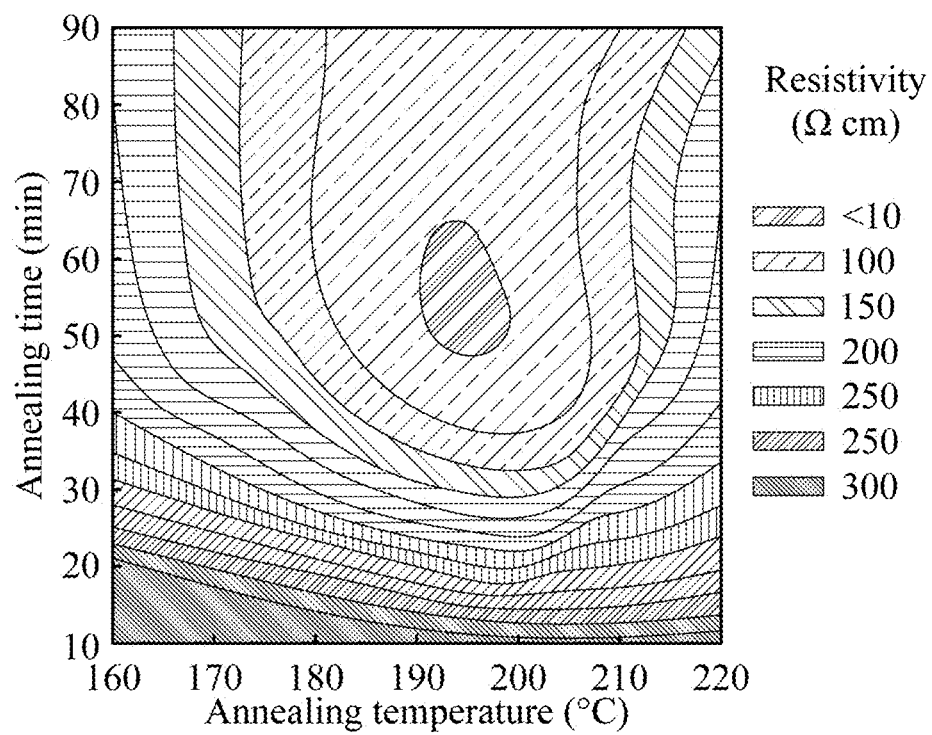
Figure 4D:
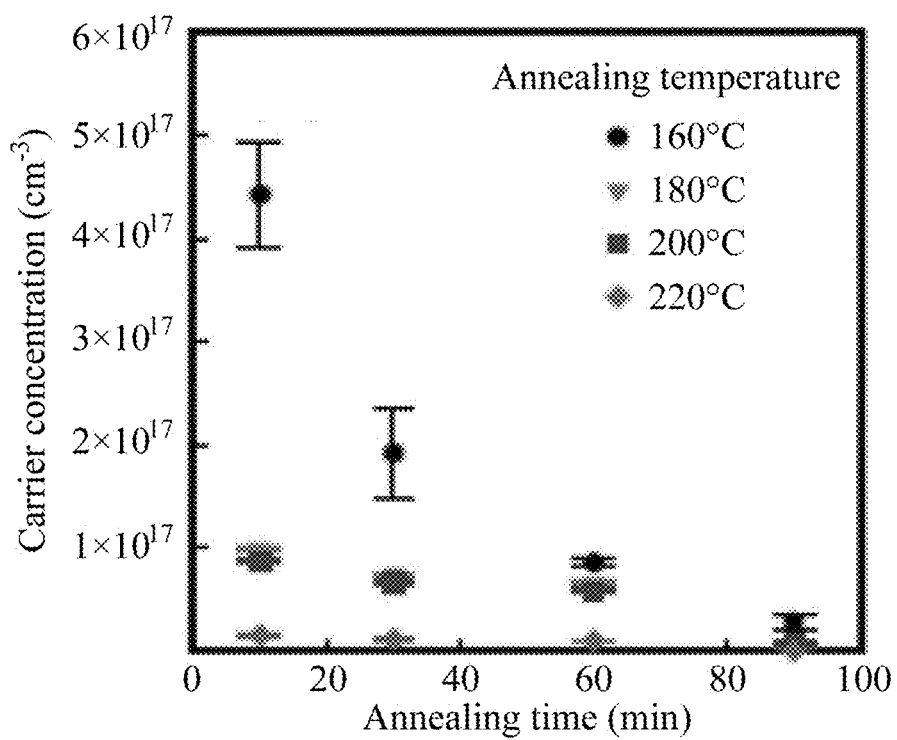
FIGS. 4D to 4F are error bar plots for carrier concentration, Hall mobility, and resistivity.
Figure 4E:
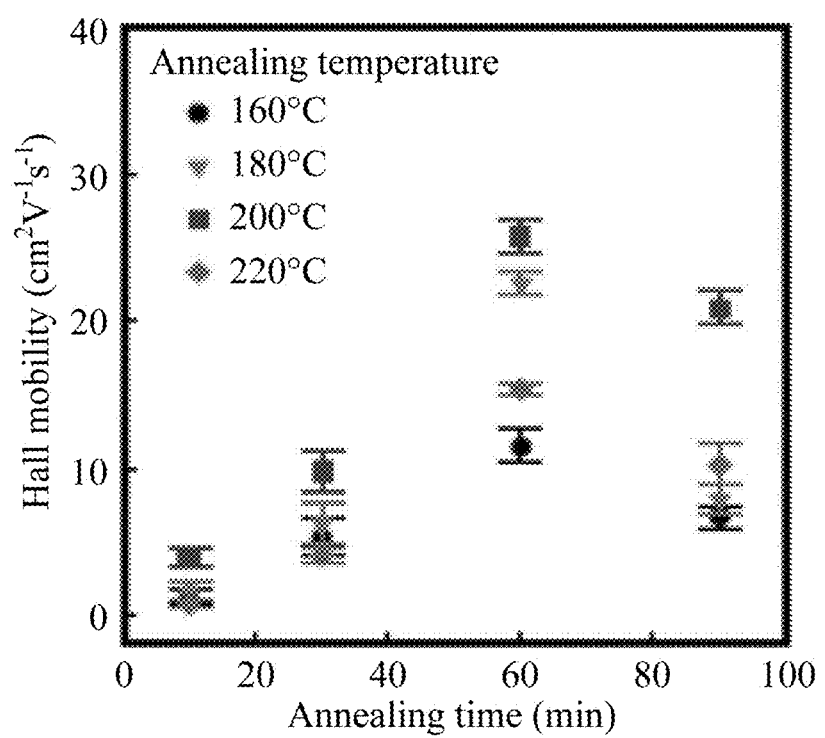
Figure 4F:
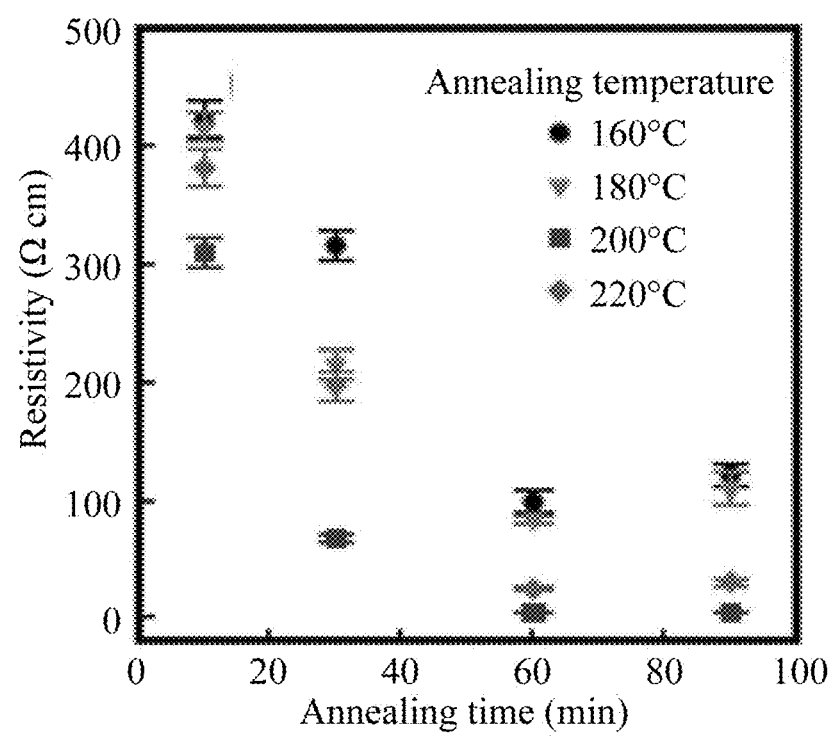

FIGS. 4A to 4C are contour plots for carrier concentration, Hall mobility, and resistivity depending on heat treatment temperature and heat treatment time in a $Cu_2SnS_3$—$Ga_2O_3$ thin film treated with ultraviolet light/ozone for 2 minutes according to an embodiment of the present disclosure, and FIGS. 4D to 4F are error bar plots for carrier concentration, Hall mobility, and resistivity.

When heat treatment is performed at a temperature of less than 160° C. and greater than 220° C., measurement is impossible due to the high resistance of the $Cu_2SnS_3$—$Ga_2O_3$ thin film.

The carrier concentration, Hall mobility, and resistivity of the $Cu_2SnS_3$—$Ga_2O_3$ thin film depending on heat treatment temperature and heat treatment time are shown in Table 2 below.

TABLE 2

| | | Heat treatment temperature | | | |
|---|---|---|---|---|---|
| | | 160° C. | 180° C. | 200° C. | 220° C. |
| Carrier concentration ($\times 10^{17}$ cm$^{-3}$) | | | | | |
| Heat treatment time | 10 min | 4.42 ± 1.02 | 0.99 ± 0.03 | 0.87 ± 0.03 | 0.16 ± 0.06 |
| | 30 min | 1.92 ± 0.90 | 0.75 ± 0.04 | 0.66 ± 0.04 | 0.12 ± 0.07 |
| | 60 min | 0.86 ± 0.08 | 0.66 ± 0.03 | 0.58 ± 0.03 | 0.08 ± 0.06 |
| | 90 min | 0.30 ± 0.01 | 0.10 ± 0.01 | 0.09 ± 0.01 | 0.02 ± 0.01 |
| Hall mobility (cm$^2$/Vs) | | | | | |
| Heat treatment time | 10 min | 1.34 ± 0.96 | 1.59 ± 1.14 | 3.87 ± 1.31 | 0.78 ± 0.52 |
| | 30 min | 5.24 ± 2.52 | 6.21 ± 2.99 | 9.78 ± 2.68 | 4.05 ± 1.68 |
| | 60 min | 11.42 ± 2.27 | 22.55 ± 1.70 | 25.77 ± 2.21 | 15.33 ± 0.78 |
| | 90 min | 6.64 ± 1.56 | 7.87 ± 1.86 | 20.87 ± 2.56 | 10.20 ± 2.86 |
| Resistivity (Ω cm) | | | | | |
| Heat treatment time | 10 min | 422.22 ± 32.21 | 415.10 ± 24.45 | 310.75 ± 25.24 | 381.44 ± 33.45 |
| | 30 min | 315.16 ± 23.11 | 215.65 ± 23.54 | 67.24 ± 72.25 | 197.72 ± 25.62 |
| | 60 min | 98.60 ± 19.15 | 83.60 ± 70.75 | 4.02 ± 0.37 | 24.74 ± 1.78 |
| | 90 min | 121.21 ± 17.35 | 109.04 ± 28.12 | 5.07 ± 1.14 | 30.77 ± 6.84 |

Referring to FIG. 3B, the Cu 2p spectrum exhibits a strong peak of Cu $2p_{3/2}$ at 932.7 eV and a strong peak of Cu $2p_{1/2}$ at 952.5 eV. From these results, it can be confirmed that $Cu_2SnS_3$ is present.

Referring to FIG. 3C, in the Sn 3d spectrum, four different peaks, i.e., two peaks of $Sn^{2+}$ (495.2 eV) and $Sn^{4+}$ (495.6 eV) for Sn $3d_{3/2}$ and two peaks of $Sn^{2+}$ (486.8 eV) and $Sn^{4+}$ (487.3 eV) for Sn $3d_{5/2}$, are fitted.

At about 485.2 eV, Sn metal is not detected, indicating that Sn is present in the form of $Cu_2SnS_3$.

Referring to FIG. 3D, it can be seen that, in the S 2p spectrum, three distinct peaks are observed at 161.0 eV, 162.6 eV, and 164.0 eV, respectively, by a metal sulfide, CuS, and $CuS_2$. Based on these results, the chemical composition of $Cu_2SnS_3$ can be determined.

Referring to FIG. 3E, in the Ga 2p spectrum, peaks of 1118.4 eV and 1145.3 eV corresponding to Ga$2p_{3/2}$ and Ga$2p_{1/2}$, respectively, are observed. From the binding energy, it can be seen that Ga is in a trivalent oxidation state ($Ga^{3+}$).

Referring to FIGS. 4A to 4F and Table 2, although the band gap is about 3.7 eV, the carrier concentration is larger than $10^{16}$ cm$^{-3}$, and the Hall mobility is increased as heat treatment temperature and heat treatment time are increased.

In addition, it can be confirmed that the $Cu_2SnS_3$—$Ga_2O_3$ thin film is a p-type oxide semiconductor based on the result that the $Cu_2SnS_3$—$Ga_2O_3$ thin film has a positive carrier concentration value.

In addition, it can be seen that, when heat treatment temperature is 200° C. and heat treatment time is 60 minutes, the highest hole mobility and the lowest resistivity are observed.

Figure 5A:
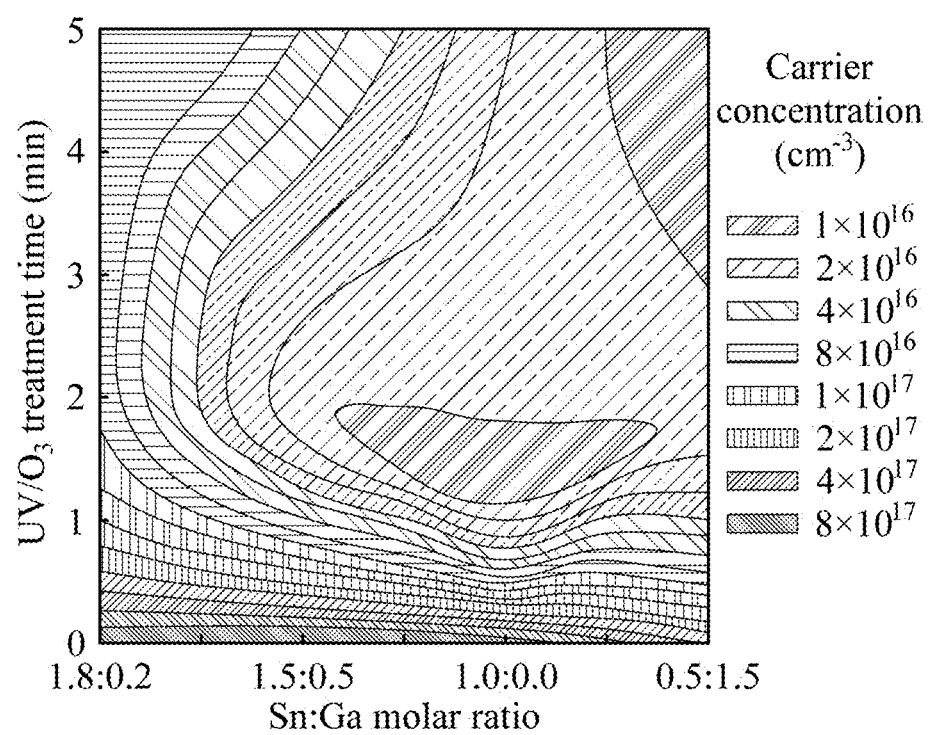
FIGS. 5A to 5C are contour plots for carrier concentration, Hall mobility, and resistivity depending on ultraviolet light/ozone treatment time and molar ratios of Sn to Ga (Sn:Ga) in a $Cu_2SnS_3$—$Ga_2O_3$ thin film heat-treated at 200° C. for 60 minutes according to an embodiment of the present disclosure.
Figure 5B:
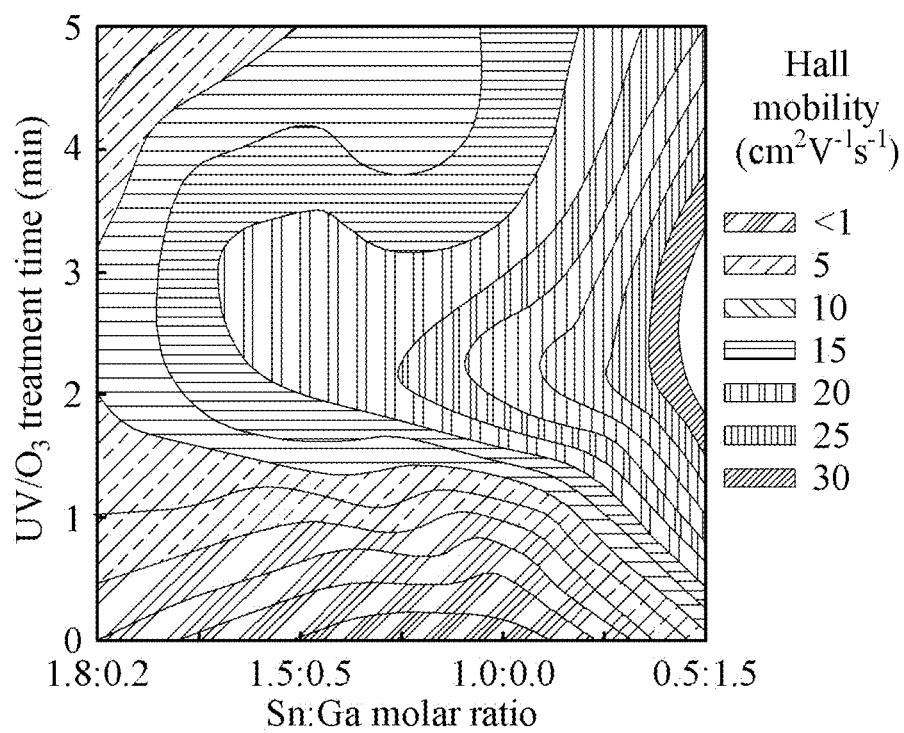
Figure 5C:
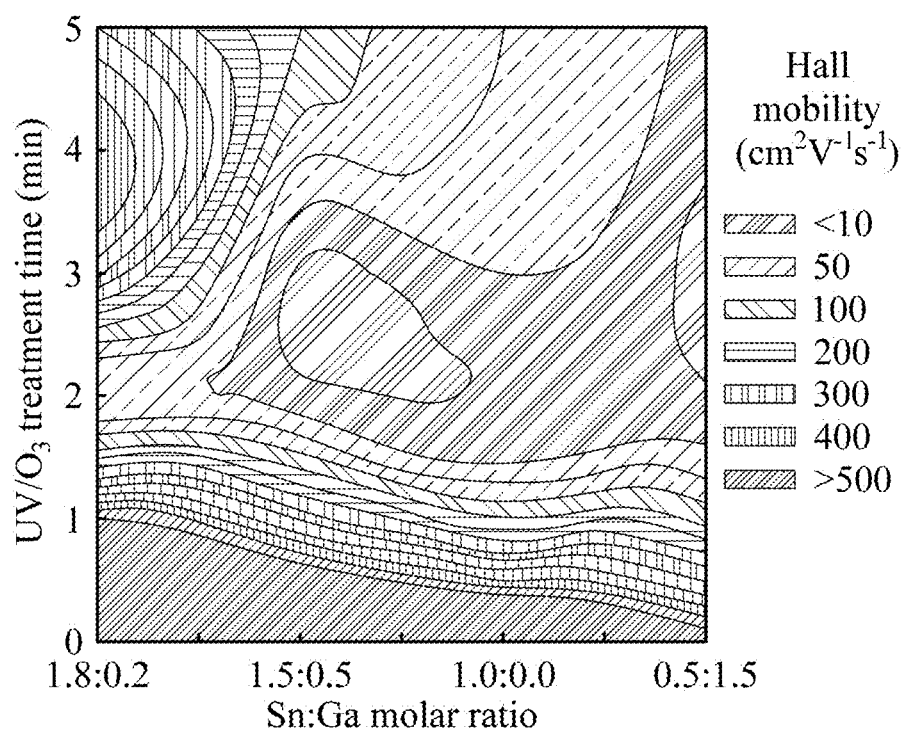
Figure 5D:
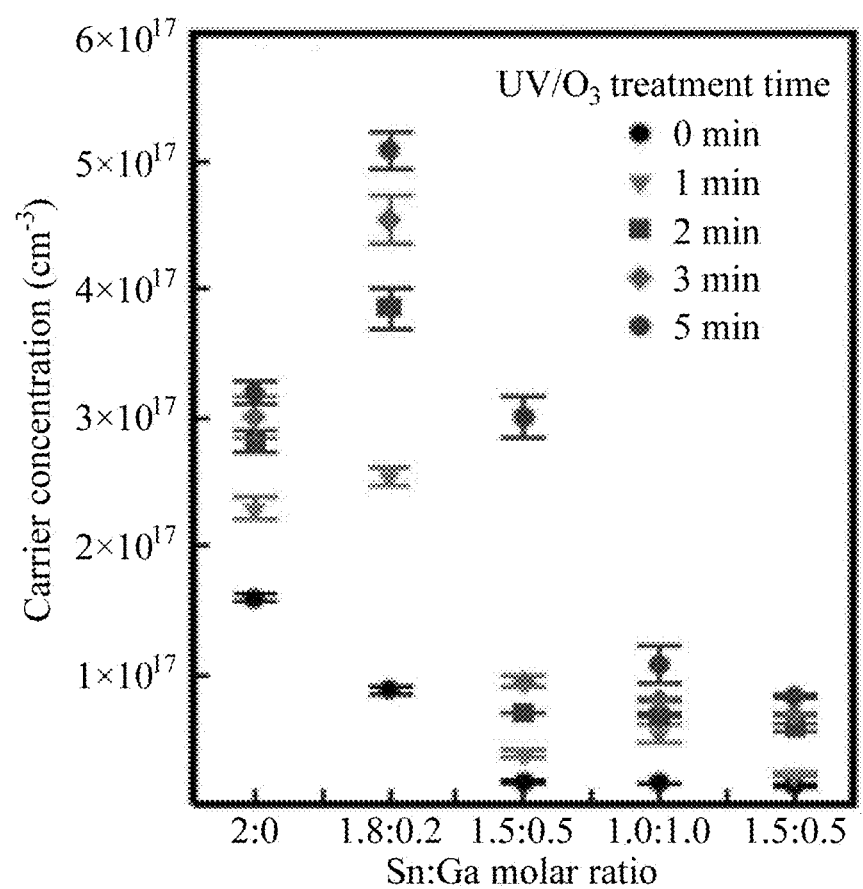
FIGS. 5D to 5F are error bar plots for carrier concentration, Hall mobility, and resistivity.
Figure 5E:
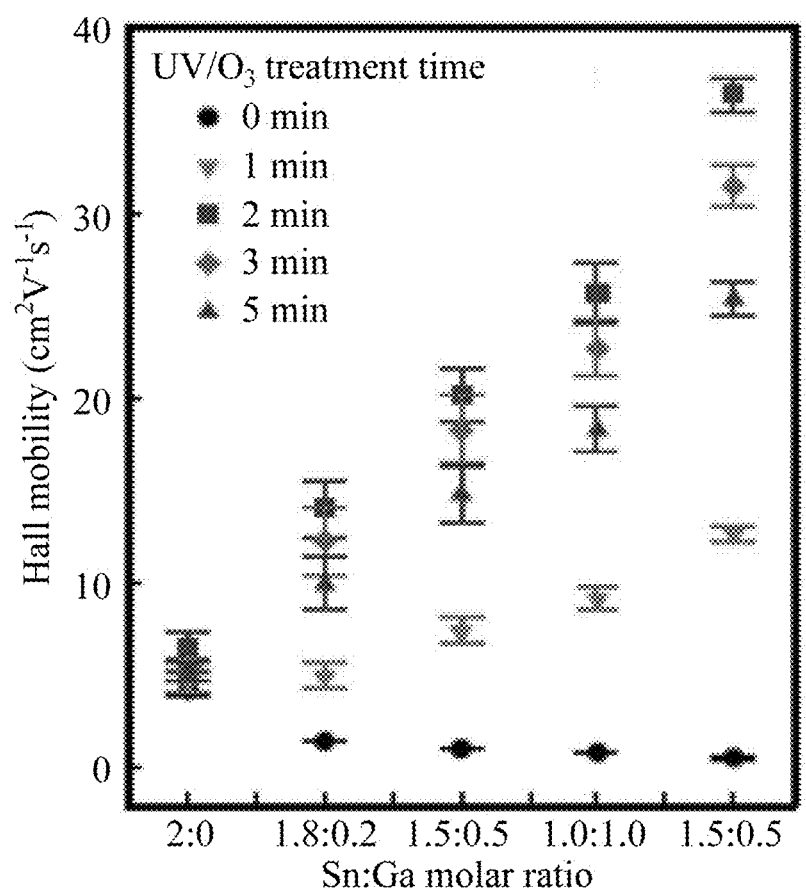
Figure 5F:
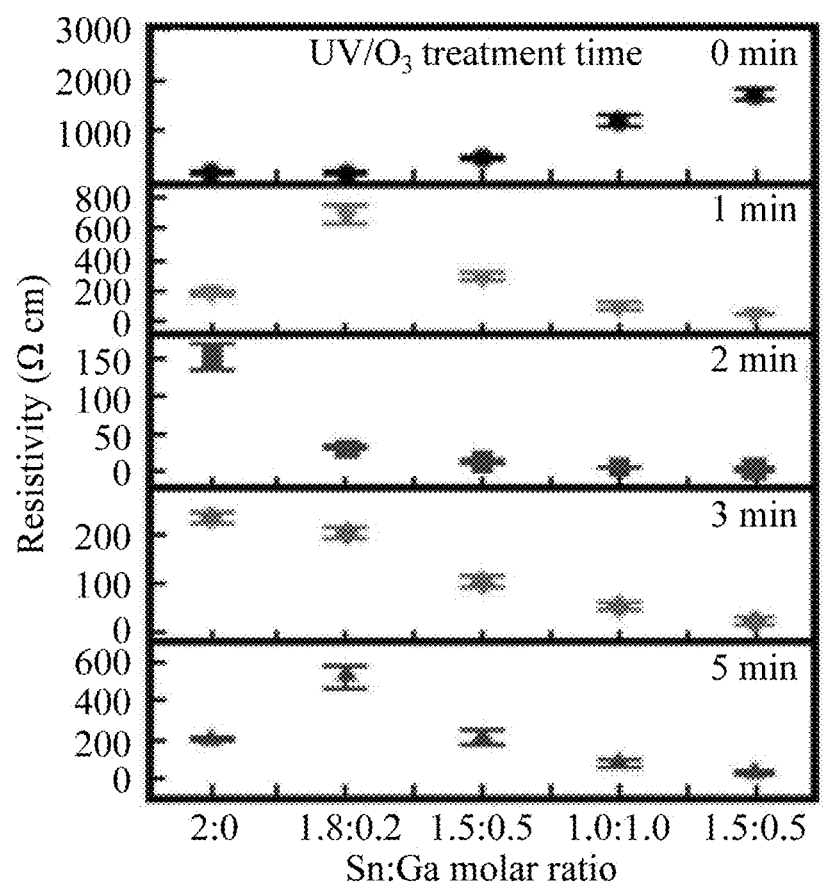

FIGS. 5A to 5C are contour plots for carrier concentration, Hall mobility, and resistivity depending on ultraviolet light/ozone treatment time and molar ratios of Sn to Ga (Sn:Ga) in a $Cu_2SnS_3$—$Ga_2O_3$ thin film heat-treated at 200° C. for 60 minutes according to an embodiment of the present disclosure, and FIGS. 5D to 5F are error bar plots for carrier concentration, Hall mobility, and resistivity.

The carrier concentration, Hall mobility, and resistivity of the $Cu_2SnS_3$—$Ga_2O_3$ thin film depending on ultraviolet light/ozone treatment time and molar ratios of Sn to Ga (Sn:Ga) are shown in Table 3 below.

TABLE 3

| | | Ultraviolet light/ozone treatment time | | | |
|---|---|---|---|---|---|
| | | 0 min | 2 min | 3 min | 5 min |
| Carrier concentration ($\times 10^{17}$ cm$^{-3}$) | | | | | |
| Molar ratio of Sn:Ga | 1.8:0.2 | 0.88 ± 0.07 | 3.86 ± 0.31 | 4.54 ± 0.37 | 5.09 ± 0.30 |
| | 1.5:0.5 | 0.16 ± 0.01 | 0.70 ± 0.02 | 0.94 ± 0.07 | 3.01 ± 0.32 |
| | 1.0:1.0 | 0.15 ± 0.01 | 0.68 ± 0.03 | 0.80 ± 0.04 | 1.08 ± 0.30 |
| | 0.5:1.5 | 0.13 ± 0.01 | 0.58 ± 0.04 | 0.69 ± 0.04 | 0.82 ± 0.04 |
| Hall mobility (cm$^2$/Vs) | | | | | |
| Molar ratio of Sn:Ga | 1.8:0.2 | 0.56 ± 0.16 | 14.00 ± 3.16 | 12.26 ± 3.54 | 9.90 ± 2.86 |
| | 1.5:0.5 | 0.83 ± 0.16 | 20.10 ± 2.86 | 18.28 ± 3.60 | 14.76 ± 2.90 |
| | 1.0:1.0 | 1.03 ± 0.13 | 25.63 ± 3.11 | 22.65 ± 2.94 | 18.28 ± 2.37 |
| | 0.5:1.5 | 1.43 ± 0.10 | 36.34 ± 1.92 | 31.37 ± 2.18 | 25.32 ± 1.75 |
| Resistivity (Ω cm) | | | | | |
| Molar ratio of Sn:Ga | 1.8:0.2 | 183.80 ± 71.5 | 32.21 ± 6.78 | 200.80 ± 27.96 | 553.06 ± 95.8 |
| | 1.5:0.5 | 488.15 ± 93.41 | 12.32 ± 4.15 | 99.80 ± 23.68 | 210.43 ± 70.83 |
| | 1.0:1.0 | 1298 ± 437 | 4.63 ± 1.95 | 51.20 ± 16.3 | 79.07 ± 33.40 |
| | 0.5:1.5 | 1670 ± 48.44 | 1.88 ± 1.32 | 20.60 ± 11.1 | 32.07 ± 22.47 |

Referring to FIGS. 5A to 5F and Table 3, when ultraviolet light/ozone treatment is not performed, the resistivity of the Cu$_2$SnS$_3$—Ga$_2$O$_3$ thin film is gradually increased as the molar ratio of Ga is increased. On the other hand, when ultraviolet light/ozone treatment is performed, the resistivity of the Cu$_2$SnS$_3$—Ga$_2$O$_3$ thin film is gradually decreased as the molar ratio of Ga is increased.

These results are obtained due to the high dielectric properties of Ga$_2$O$_3$ heat-treated under a nitrogen atmosphere.

When ultraviolet light/ozone treatment time is increased from 0 minutes to 2 minutes, the Hall mobility is increased and the resistivity is decreased. When ultraviolet light/ozone treatment time is further increased, the Hall mobility is decreased and the resistivity is increased.

Based on these results, it can be seen that, when the molar ratio of Sn to Ga (Sn:Ga) is 0.5:1.5 and ultraviolet light/ozone treatment is performed for 2 minutes, the Cu$_2$SnS$_3$—Ga$_2$O$_3$ thin film has excellent electrical properties.

Figure 6A:
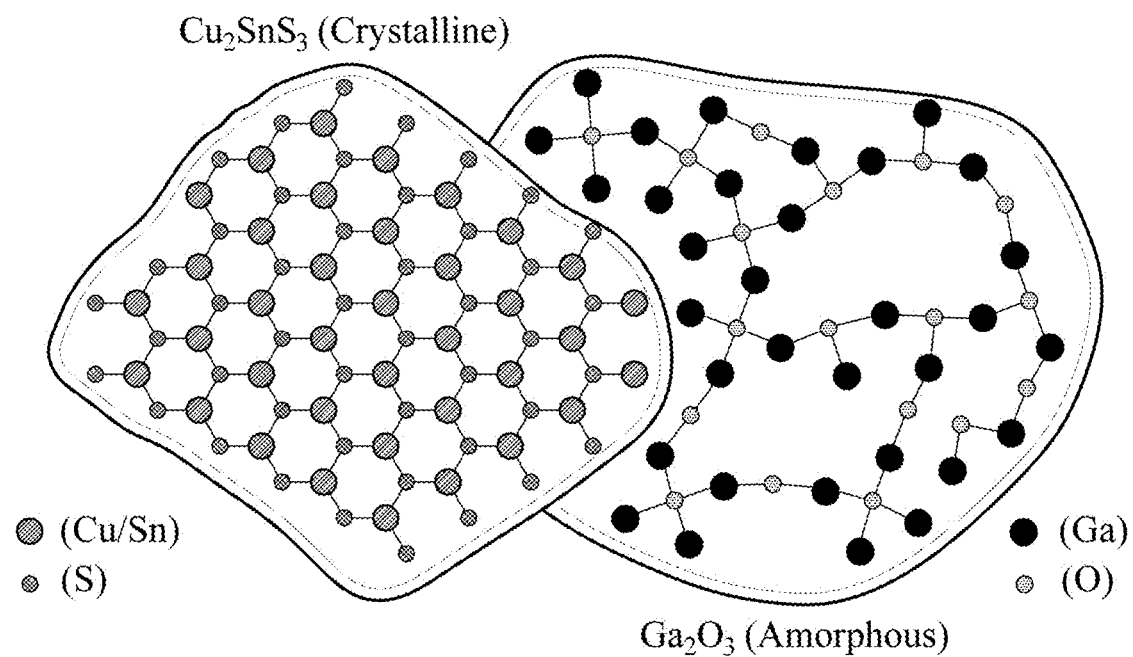
FIGS. 6A and 6B show a schematic configuration of a $Cu_2SnS_3$—$Ga_2O_3$ thin film according to an embodiment of the present disclosure consisting of crystalline $Cu_2SnS_3$ and amorphous $Ga_2O_3$, and show current flow through the $Cu_2SnS_3$—$Ga_2O_3$ thin film.
Figure 6B:
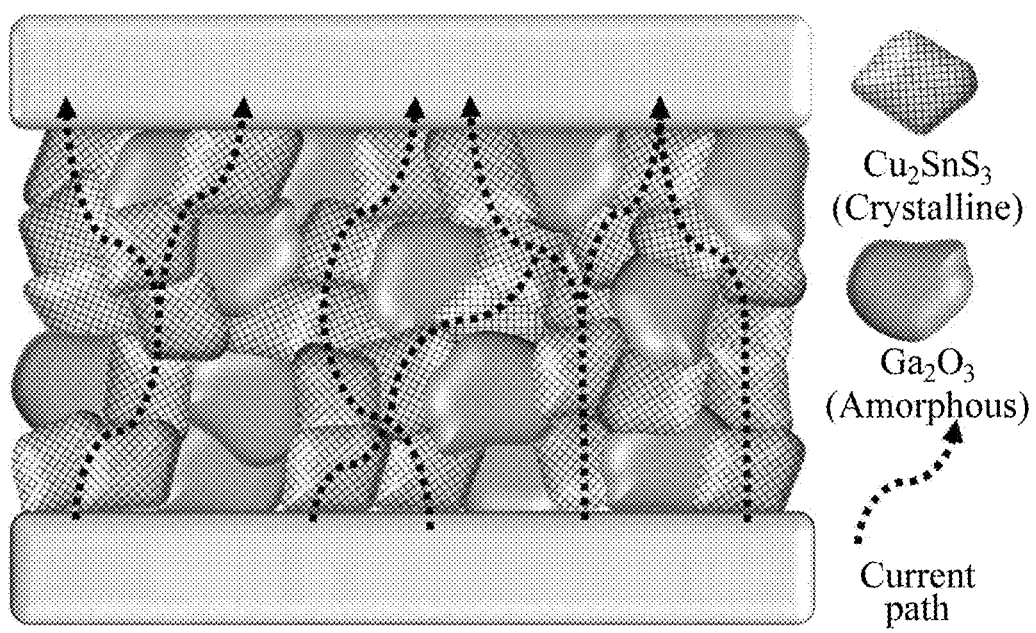

FIGS. 6A and 6B show a schematic configuration of a Cu$_2$SnS$_3$—Ga$_2$O$_3$ thin film according to an embodiment of the present disclosure consisting of crystalline Cu$_2$SnS$_3$ and amorphous Ga$_2$O$_3$, and show current flow through the Cu$_2$SnS$_3$—Ga$_2$O$_3$ thin film.

Referring to FIGS. 6A and 6B, crystalline Ga$_2$O$_3$ is known as a conductive oxide having a wide band gap, and amorphous Ga$_2$O$_3$ is an insulating material. Accordingly, current present in the Cu$_2$SnS$_3$—Ga$_2$O$_3$ thin film is generated through crystalline Ga$_2$O$_3$.

FIGS. 7A to 7D show the He (I) ultraviolet photoelectron spectroscopy (UPS) spectra of PEDOT:PSS or a Cu$_2$SnS$_3$—Ga$_2$O$_3$ thin film deposited on an ITO substrate according to an embodiment of the present disclosure.

Figure 7A:
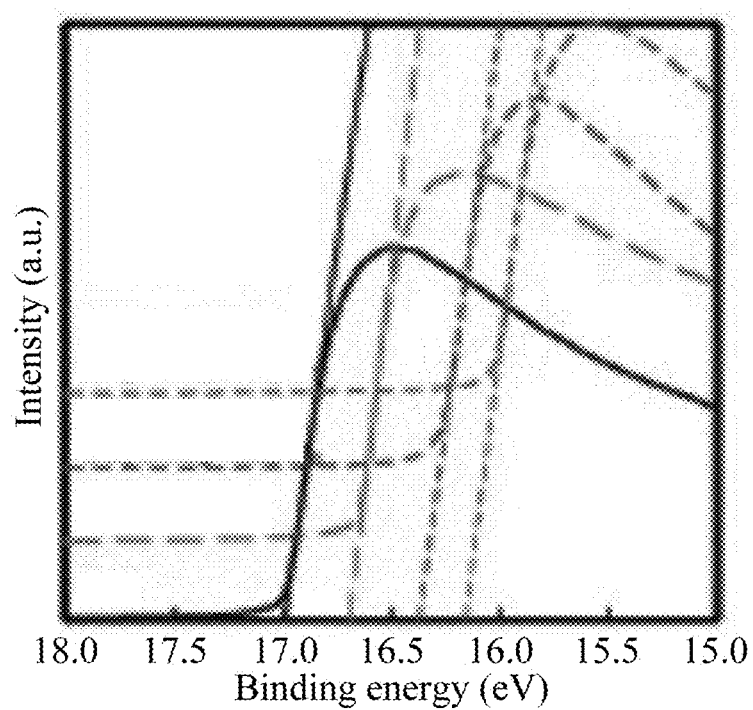
FIGS. 7A to 7D show the He (I) ultraviolet photoelectron spectroscopy (UPS) spectra of PEDOT:PSS or a $Cu_2SnS_3$—$Ga_2O_3$ thin film deposited on an ITO substrate according to an embodiment of the present disclosure.

Referring to FIG. 7A, it can be seen that the work functions of the untreated Cu$_2$SnS$_3$—Ga$_2$O$_3$ thin film, the ultraviolet light/ozone-treated Cu$_2$SnS$_3$—Ga$_2$O$_3$ thin film, and PEDOT:PSS can be obtained by the intercepts between the extrapolation of the leading edge and the extrapolation level in a high binding energy region.

According to the secondary electron cut-offs of the untreated Cu$_2$SnS$_3$—Ga$_2$O$_3$ thin film, the ultraviolet light/ozone-treated Cu$_2$SnS$_3$—Ga$_2$O$_3$ thin film, and PEDOT:PSS, work functions thereof are 4.51 eV, 4.92 eV, and 5.17 eV, respectively, and the work function of ITO is about 4.2 eV.

Figure 7B:
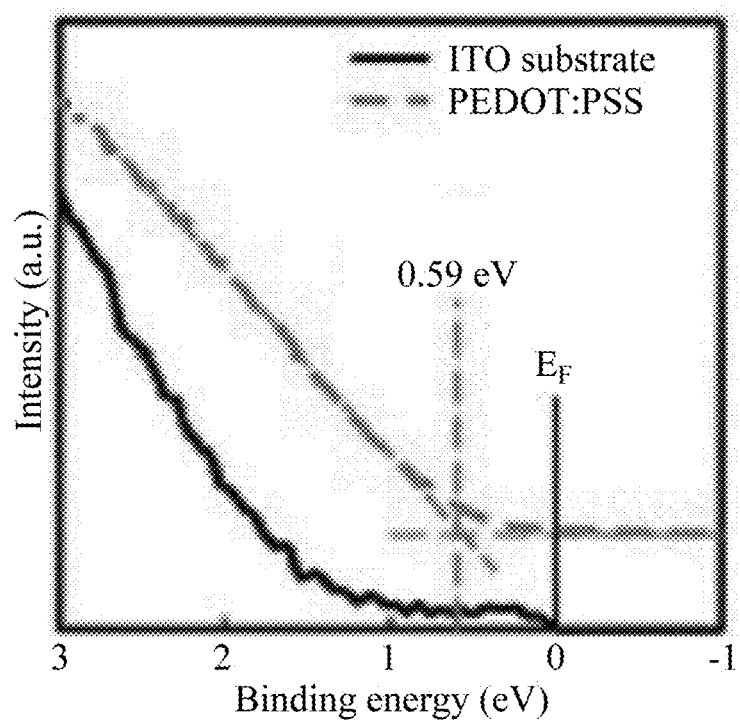
Figure 7C:
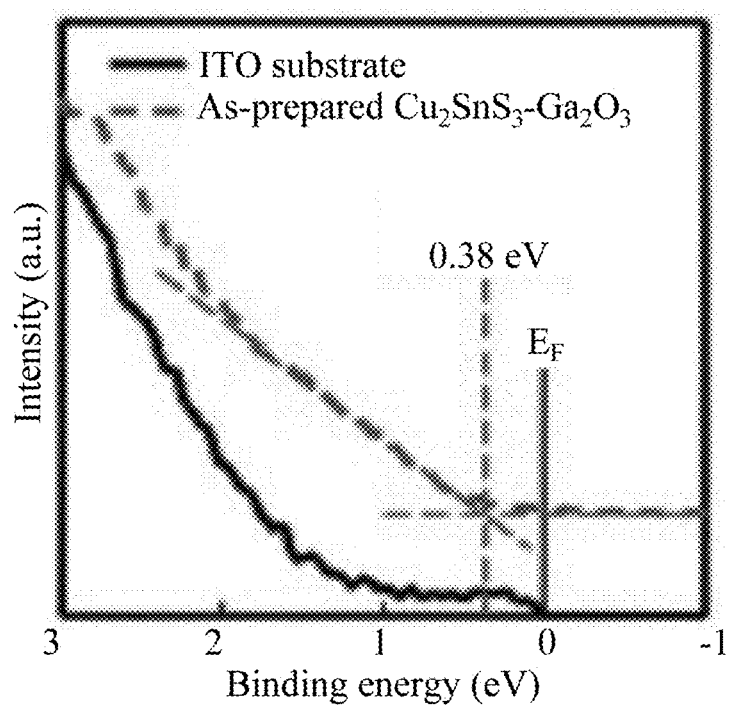
Figure 7D:
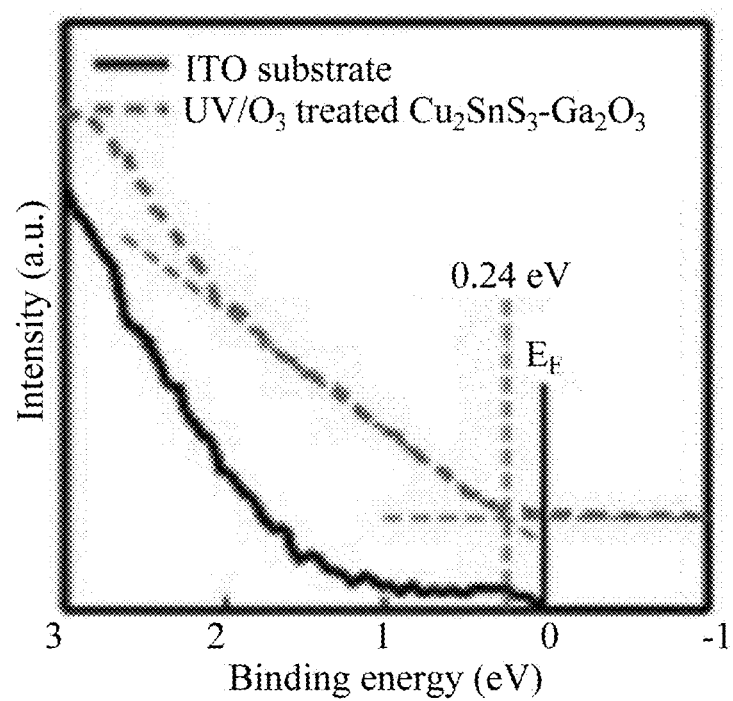

Referring to FIGS. 7B to 7D, it can be seen that the VB edges of the untreated Cu$_2$SnS$_3$—Ga$_2$O$_3$ thin film, the ultraviolet light/ozone-treated Cu$_2$SnS$_3$—Ga$_2$O$_3$ thin film, and PEDOT:PSS are 0.59 eV, 0.38 eV, and 0.24 eV, respectively, under the Fermi level of ITO.

The ionization potential ($E_{ion}$) can be obtained by summing the work function and the VB edge energy. The ionization potentials of the untreated Cu$_2$SnS$_3$—Ga$_2$O$_3$ thin film, the ultraviolet light/ozone-treated Cu$_2$SnS$_3$—Ga$_2$O$_3$ thin film, and PEDOT:PSS are as follows.

$E_{ion}$ (Untreated Cu$_2$SnS$_3$—Ga$_2$O$_3$ thin film)=4.92+0.38=5.30 eV $E_{ion}$ (Ultraviolet light/ozone-treated Cu$_2$SnS$_3$—Ga$_2$O$_3$ thin film)=5.17+0.24=5.41 eV $E_{ion}$ (PEDOT:PSS)=4.51+0.59=5.10 eV From the above calculations, it can be seen that the ionization potential ($E_{ion}$) of the Cu$_2$SnS$_3$—Ga$_2$O$_3$ thin film is larger than that of PEDOT:PSS. These results indicate that the Cu$_2$SnS$_3$—Ga$_2$O$_3$ thin film is suitable as the hole injection layer of a quantum dot diode.

Figure 8A:
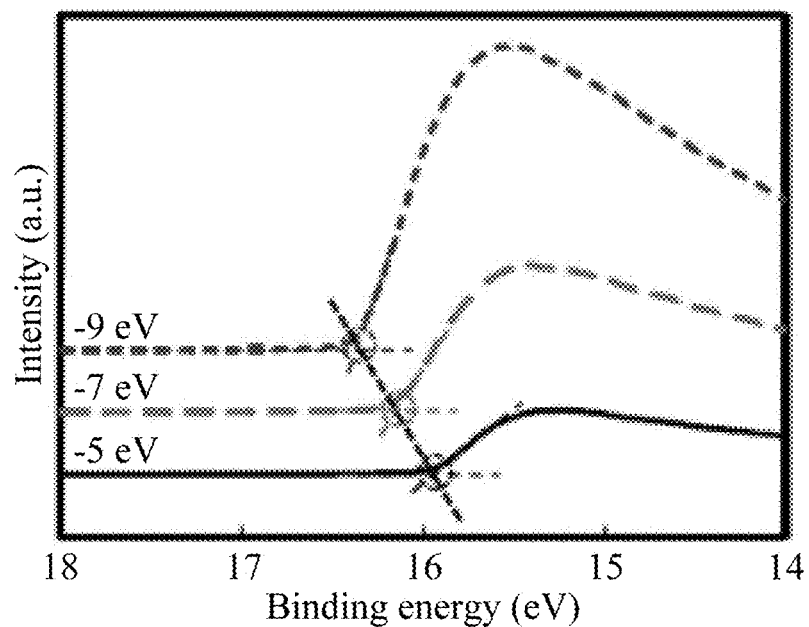
FIG. 8A shows UPS spectra in the secondary electron cut-off regions of a $Cu_2SnS_3$—$Ga_2O_3$ thin film measured at various negative biases.
Figure 8B:
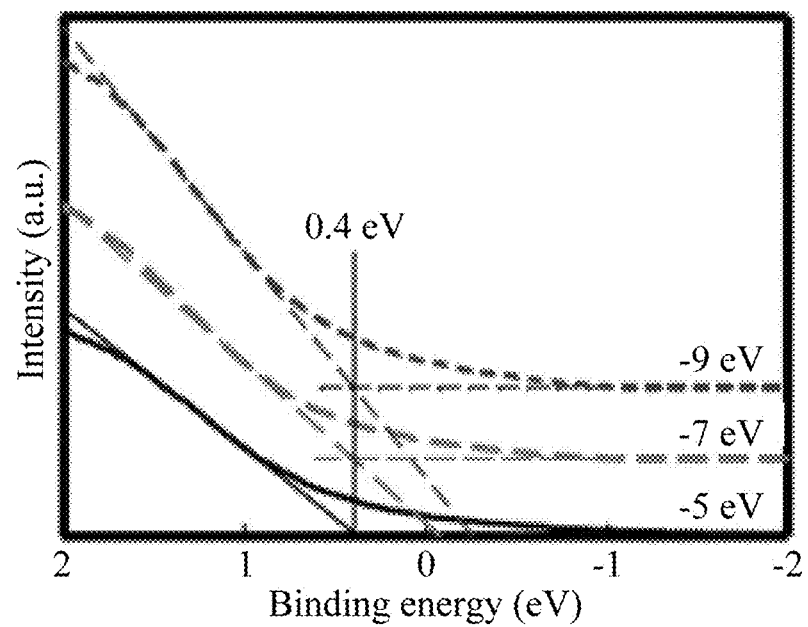
FIG. 8B shows UPS spectra in the VB edges of the $Cu_2SnS_3$—$Ga_2O_3$ thin film.

FIG. 8A shows UPS spectra in the secondary electron cut-off regions of a Cu$_2$SnS$_3$—Ga$_2$O$_3$ thin film measured at various negative biases, and FIG. 8B shows UPS spectra in the VB edges of the Cu$_2$SnS$_3$—Ga$_2$O$_3$ thin film.

Referring to FIG. 8A, it can be seen that the secondary electron cut-off region shifts to higher binding energy as the negative bias is increased.

Referring to FIG. 8B, it can be seen that, at various negative biases, the VB edge from the work function of the Cu$_2$SnS$_3$—Ga$_2$O$_3$ thin film is independent of the negative biases.

Figure 9A:
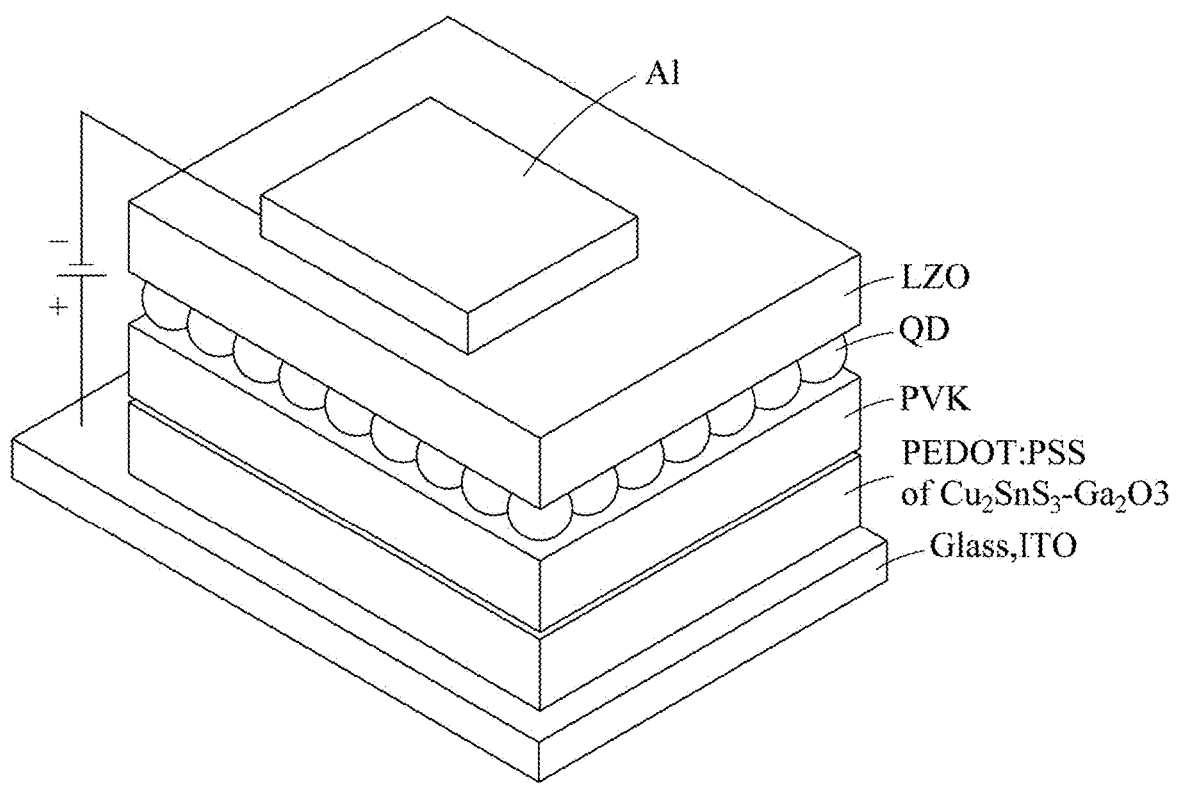
FIG. 9A is a cross-sectional view of a quantum dot light-emitting diode according to an embodiment of the present disclosure.
Figure 9B:
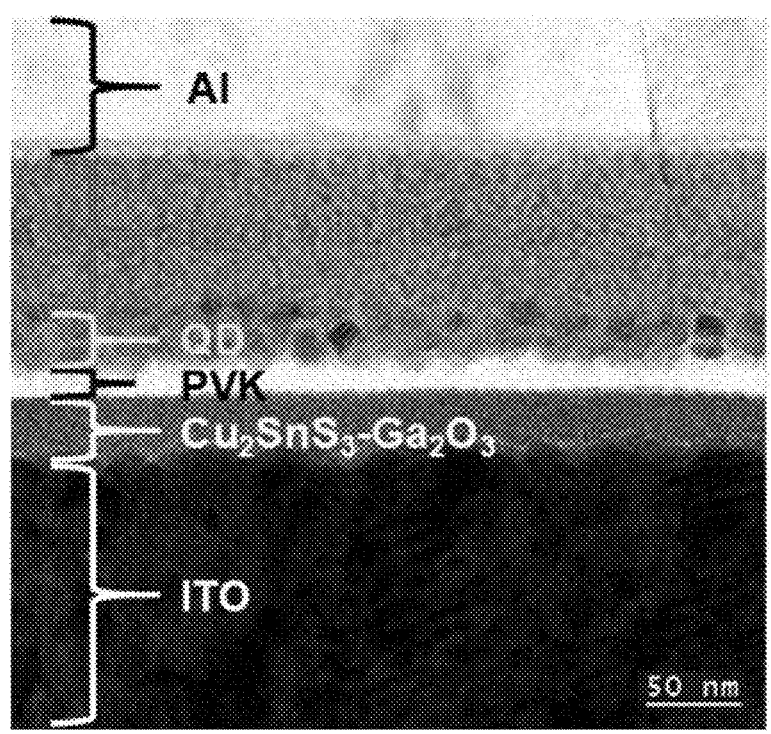
FIG. 9B is a cross-sectional view of a TEM image of the quantum dot light-emitting diode.

FIG. 9A is a cross-sectional view of a quantum dot light-emitting diode according to an embodiment of the present disclosure, and FIG. 9B is a cross-sectional view of a TEM image of the quantum dot light-emitting diode.

Figure 9C:
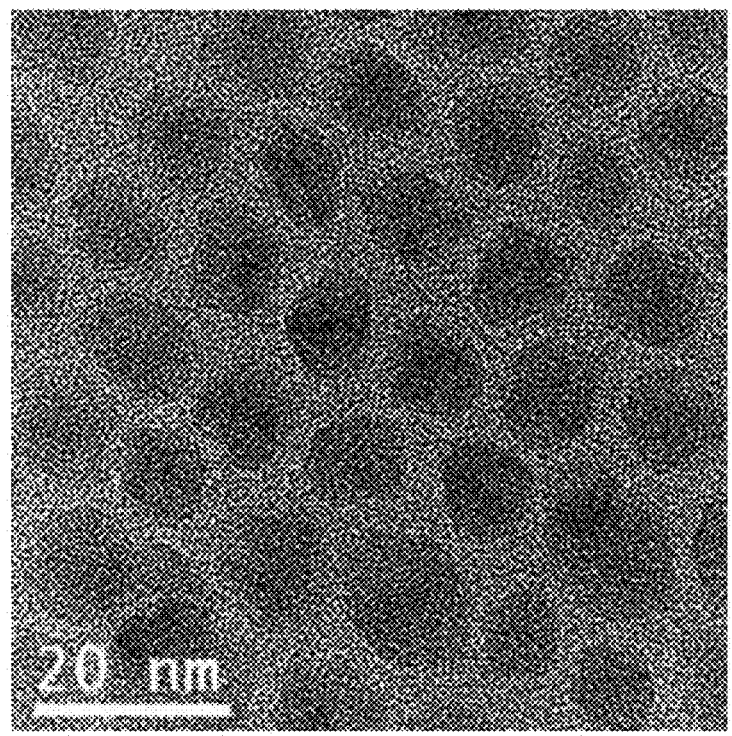
FIG. 9C is an HRTEM image of green quantum dots according to an embodiment of the present disclosure.
Figure 9D:
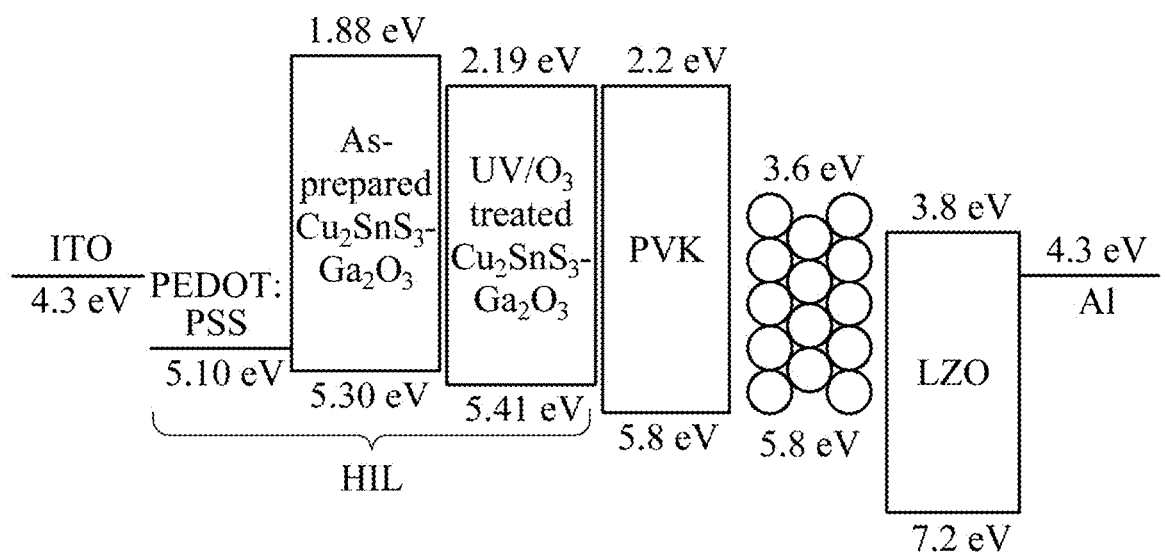
FIG. 9D illustrates energy band diagrams of quantum dot light-emitting diodes including various hole injection layers.

FIG. 9C is an HRTEM image of green quantum dots according to an embodiment of the present disclosure, and FIG. 9D illustrates energy band diagrams of quantum dot light-emitting diodes including various hole injection layers.

Referring to FIGS. 9A and 9B, it can be seen that the green quantum dot light-emitting diode has a structure of ITO/PEDOT:PSS (30 nm)/PVK (15 nm)/green quantum dots/Li doping ZnO (LZO) (70 nm)/Al (100 nm).

CdSe/CdS/ZnS green quantum dots are used as a light-emitting layer, and PVK and LZO are used as a hole transport layer and an electron transport layer, respectively.

Referring to FIGS. 9A to 9D, it can be seen that the $Cu_2SnS_3$—$Ga_2O_3$ thin film is uniformly deposited on an ITO substrate, and the surface of the $Cu_2SnS_3$—$Ga_2O_3$ thin film is smoothly formed.

Figure 10A:
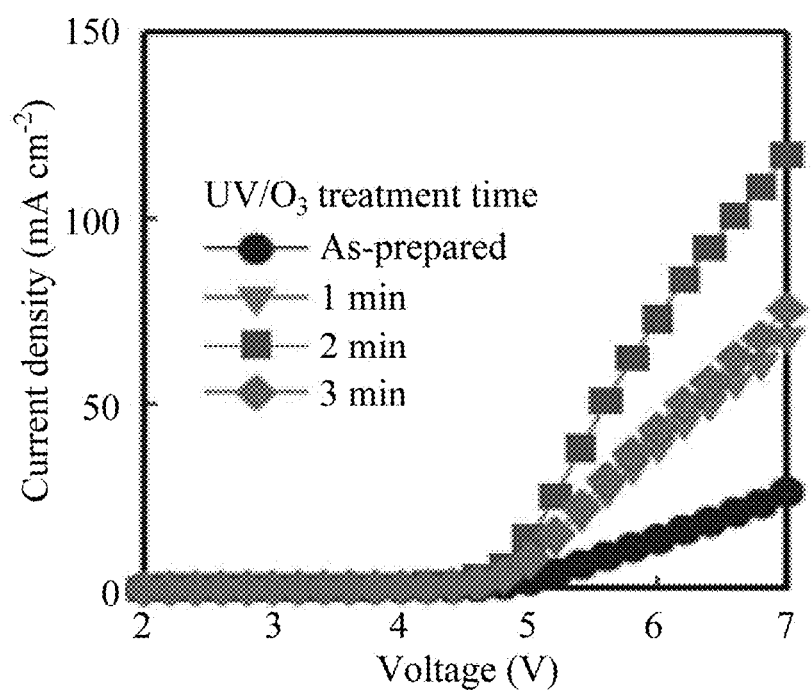
FIG. 10A is a graph showing the current density-voltage (J-V) characteristics of a quantum dot light-emitting diode including a $Cu_2SnS_3$—$Ga_2O_3$ thin film according to an embodiment of the present disclosure depending on ultraviolet light/ozone treatment time.
Figure 10B:
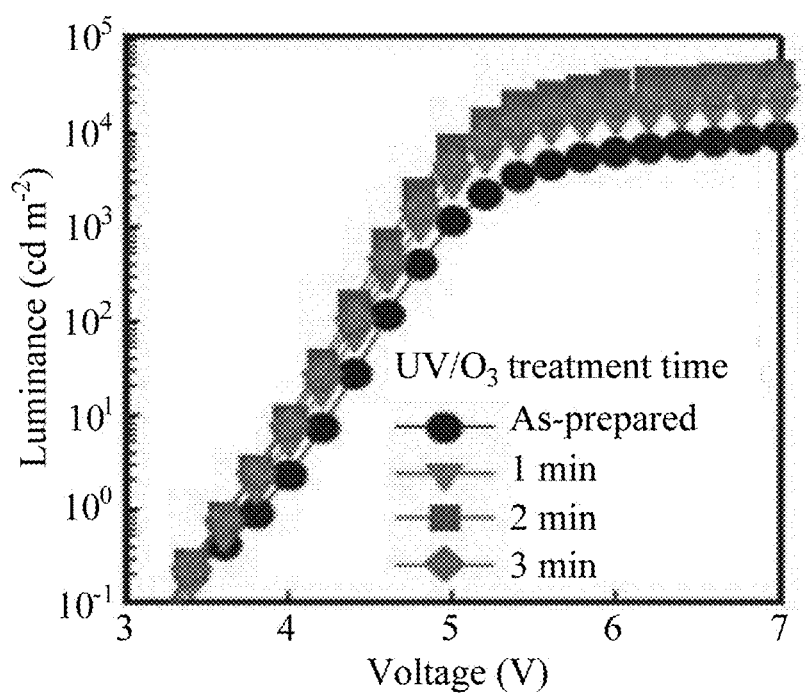
FIG. 10B is a graph showing the luminance-voltage (L-V) characteristics of the quantum dot light-emitting diode.
Figure 10C:
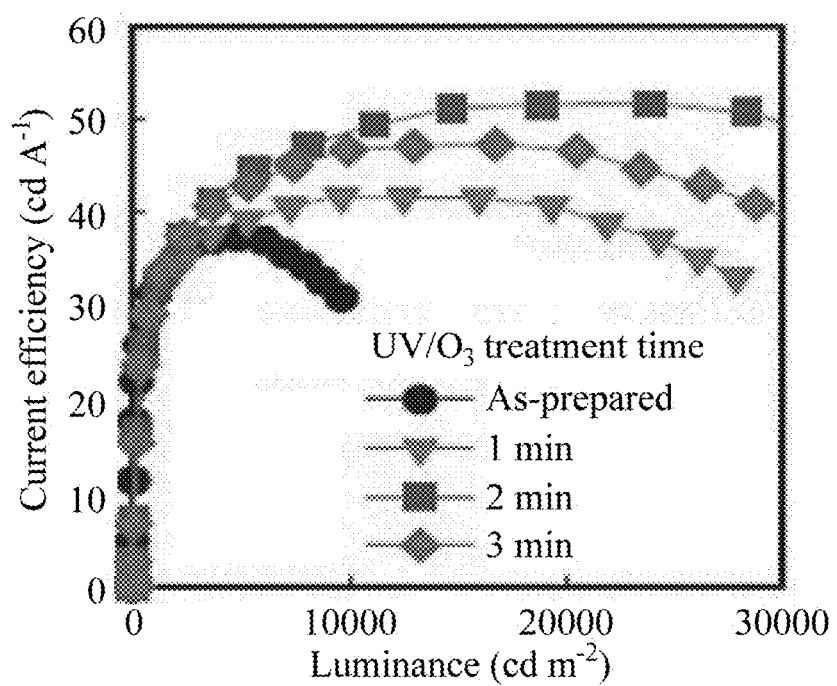
FIG. 10C is a graph showing the current efficiency-luminance (C/E-L) characteristics of the quantum dot light-emitting diode.

FIG. 10A is a graph showing the current density-voltage (J-V) characteristics of a quantum dot light-emitting diode including a $Cu_2SnS_3$—$Ga_2O_3$ thin film according to an embodiment of the present disclosure depending on ultraviolet light/ozone treatment time, FIG. 10B is a graph showing the luminance-voltage (L-V) characteristics of the quantum dot light-emitting diode, and FIG. 10C is a graph showing the current efficiency-luminance (C/E-L) characteristics of the quantum dot light-emitting diode.

Referring to FIGS. 10A to 10C, it can be seen that current density is decreased with increasing ultraviolet light/ozone treatment time from 2 minutes to 3 minutes. Decrease in current density is caused by increase in the resistivity of the $Cu_2SnS_3$—$Ga_2O_3$ thin film, and the quantum dot light-emitting diode exhibits optimal performance when ultraviolet light/ozone treatment time is 2 minutes.

Figure 11A:
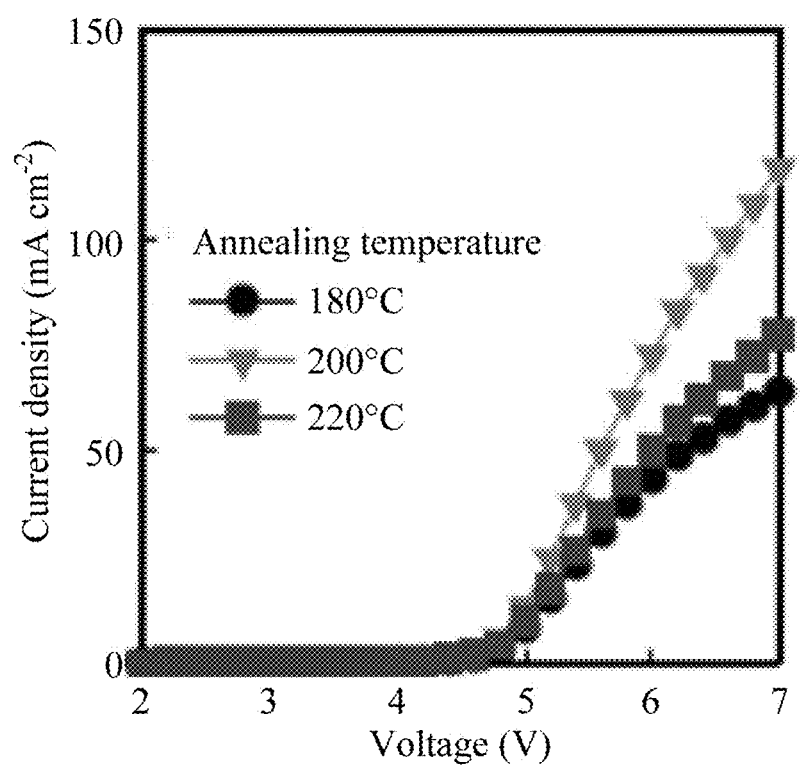
FIG. 11A is a graph showing the current density-voltage (J-V) characteristics of a quantum dot light-emitting diode including a $Cu_2SnS_3$—$Ga_2O_3$ thin film according to an embodiment of the present disclosure depending on heat treatment temperatures.
Figure 11B:
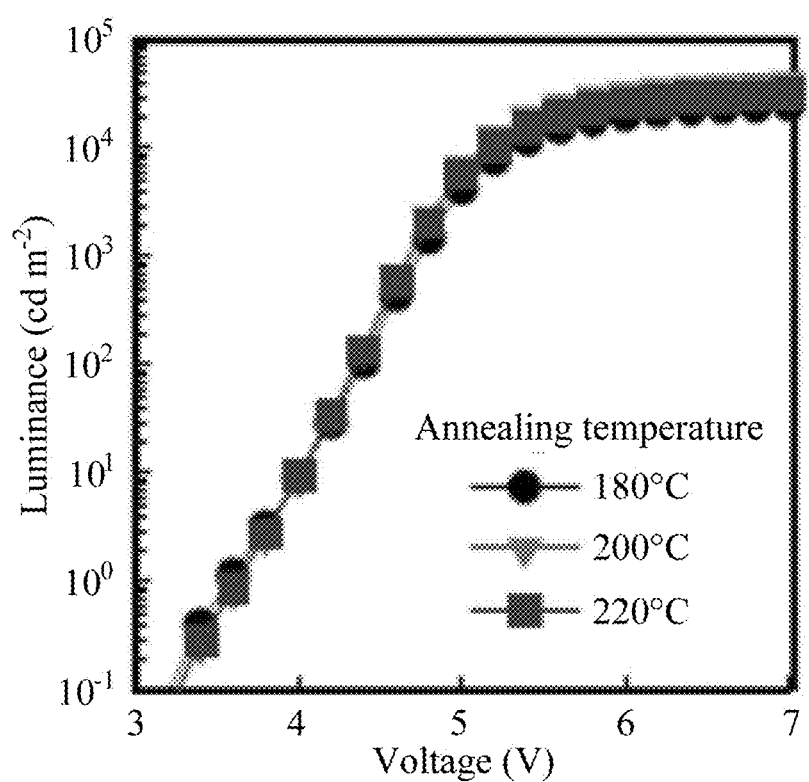
FIG. 11B is a graph showing the luminance-voltage (L-V) characteristics of the quantum dot light-emitting diode.
Figure 11C:
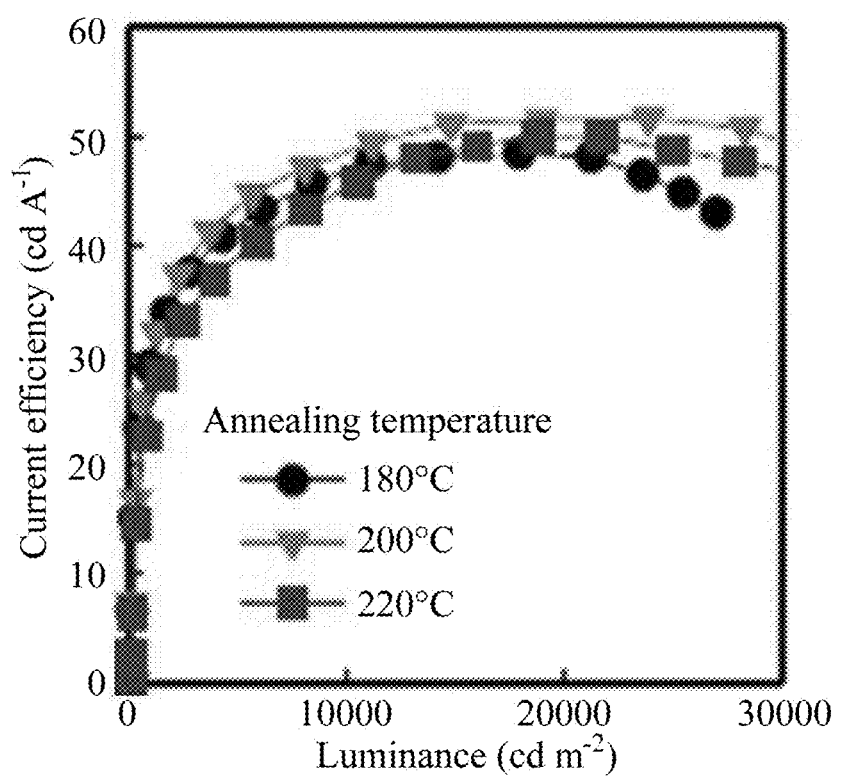
FIG. 11C is a graph showing the current efficiency-luminance (C/E-L) characteristics of the quantum dot light-emitting diode.

FIG. 11A is a graph showing the current density-voltage (J-V) characteristics of a quantum dot light-emitting diode including a $Cu_2SnS_3$—$Ga_2O_3$ thin film according to an embodiment of the present disclosure depending on heat treatment temperatures, FIG. 11B is a graph showing the luminance-voltage (L-V) characteristics of the quantum dot light-emitting diode, and FIG. 11C is a graph showing the current efficiency-luminance (C/E-L) characteristics of the quantum dot light-emitting diode.

However, when the molar ratio of Sn to Ga (Sn:Ga) is 0.5:1.5, charge carriers in the light-emitting layer are unbalanced due to the relatively low resistivity of the $Cu_2SnS_3$—$Ga_2O_3$ thin film. As a result, current efficiency is reduced.

Figure 13A:
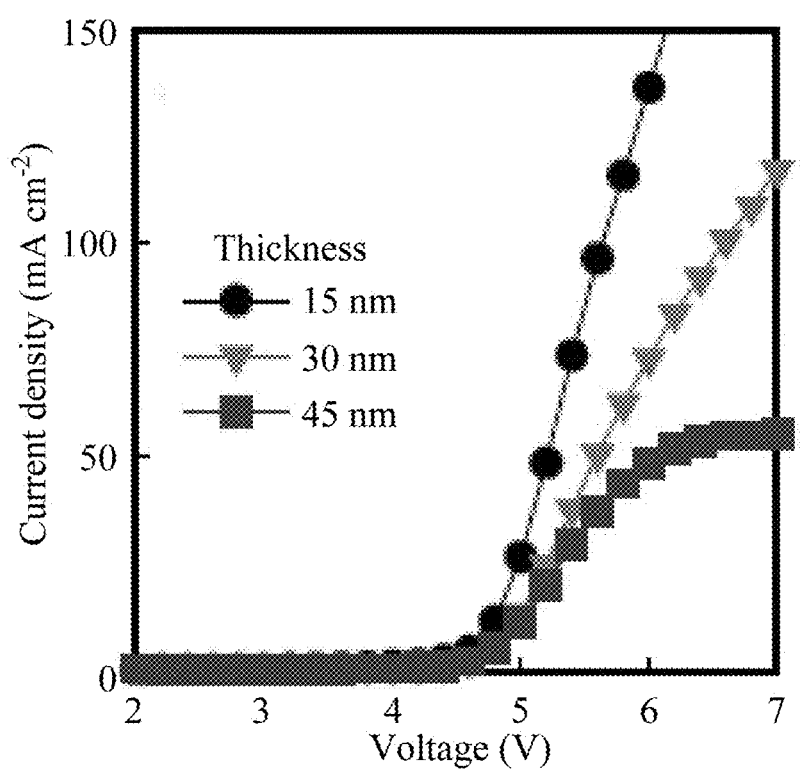
FIG. 13A is a graph showing the current density-voltage (J-V) characteristics of a quantum dot light-emitting diode according to an embodiment of the present disclosure depending on the thicknesses of a $Cu_2SnS_3$—$Ga_2O_3$ thin film.
Figure 13B:
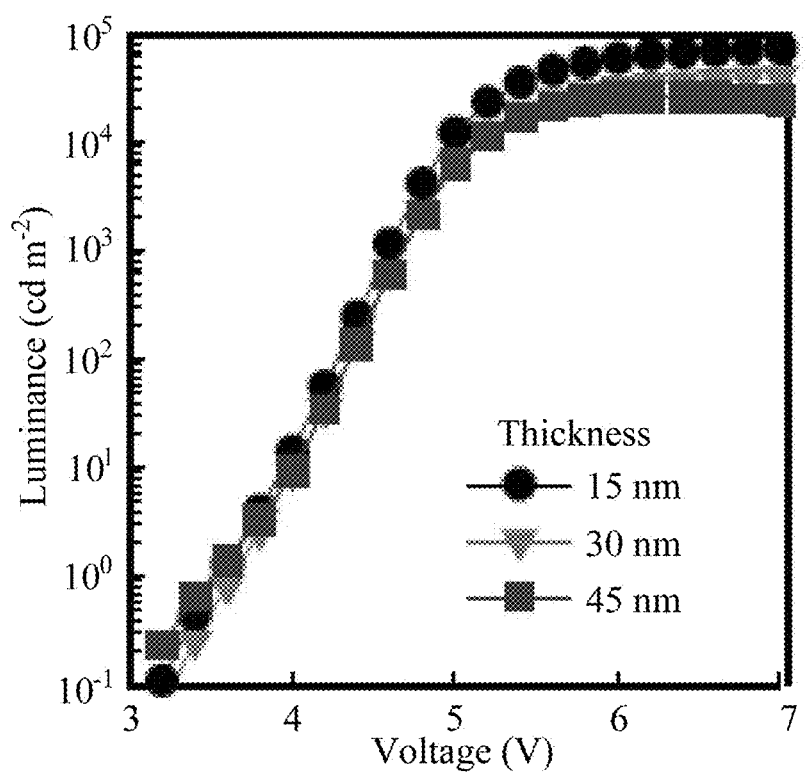
FIG. 13B is a graph showing the luminance-voltage (L-V) characteristics of the quantum dot light-emitting diode.
Figure 13C:
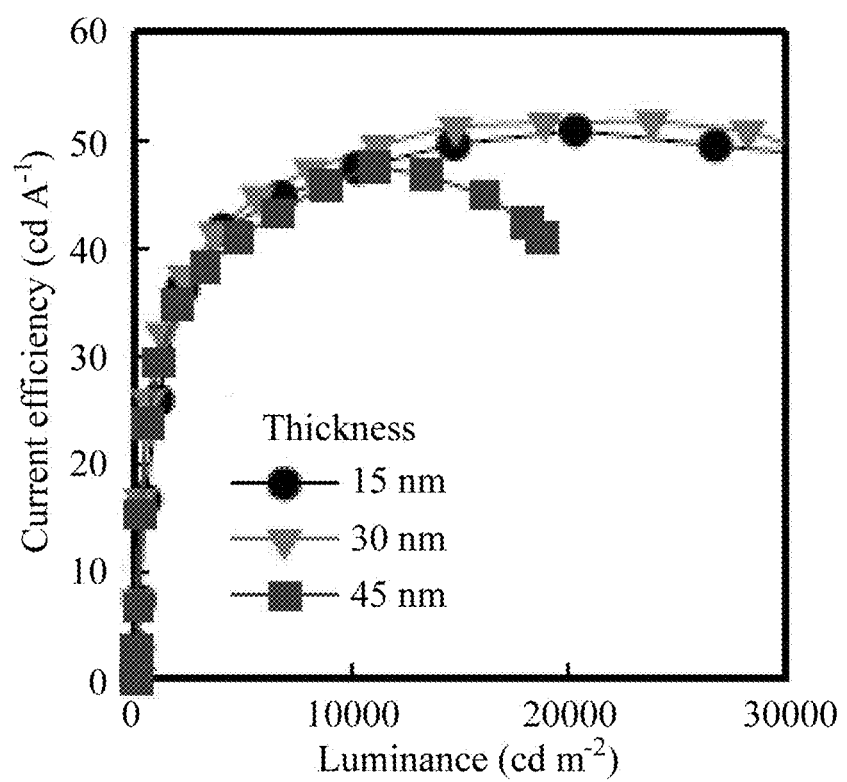
FIG. 13C is a graph showing the current efficiency-luminance (C/E-L) characteristics of the quantum dot light-emitting diode.

FIG. 13A is a graph showing the current density-voltage (J-V) characteristics of a quantum dot light-emitting diode according to an embodiment of the present disclosure depending on the thicknesses of a $Cu_2SnS_3$—$Ga_2O_3$ thin film, FIG. 13B is a graph showing the luminance-voltage (L-V) characteristics of the quantum dot light-emitting diode, and FIG. 13C is a graph showing the current efficiency-luminance (C/E-L) characteristics of the quantum dot light-emitting diode.

Referring to FIGS. 13A to 13C, when the thickness of the $Cu_2SnS_3$—$Ga_2O_3$ thin film is 15 nm or 30 nm, similar current efficiency is observed. When the thickness is 45 nm, current efficiency is dramatically reduced.

FIGS. 14A to 14E are graphs showing the characteristics of a quantum dot light-emitting diode including a PEDOT:PSS-based hole injection layer and a quantum dot light-emitting diode including a $Cu_2SnS_3$—$Ga_2O_3$ thin film-based hole injection layer having a molar ratio of Sn to Ga (Sn:Ga) of 1:1 according to an embodiment of the present disclosure.

Figure 14A:
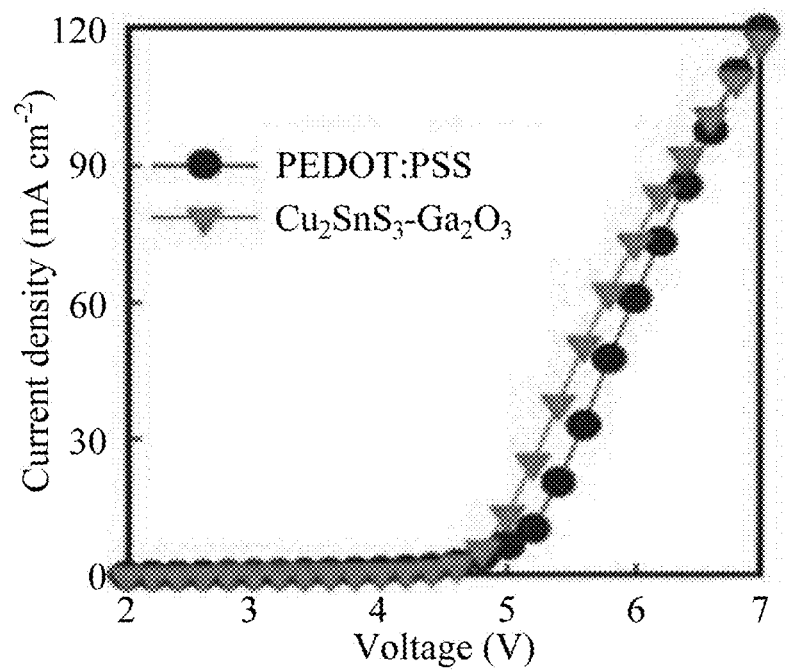
FIGS. 14A to 14E are graphs showing the characteristics of a quantum dot light-emitting diode including a PEDOT:PSS-based hole injection layer and a quantum dot light-emitting diode including a $Cu_2SnS_3$—$Ga_2O_3$ thin film-based hole injection layer having a molar ratio of Sn to Ga (Sn:Ga) of 1:1 according to an embodiment of the present disclosure.
Figure 14B:
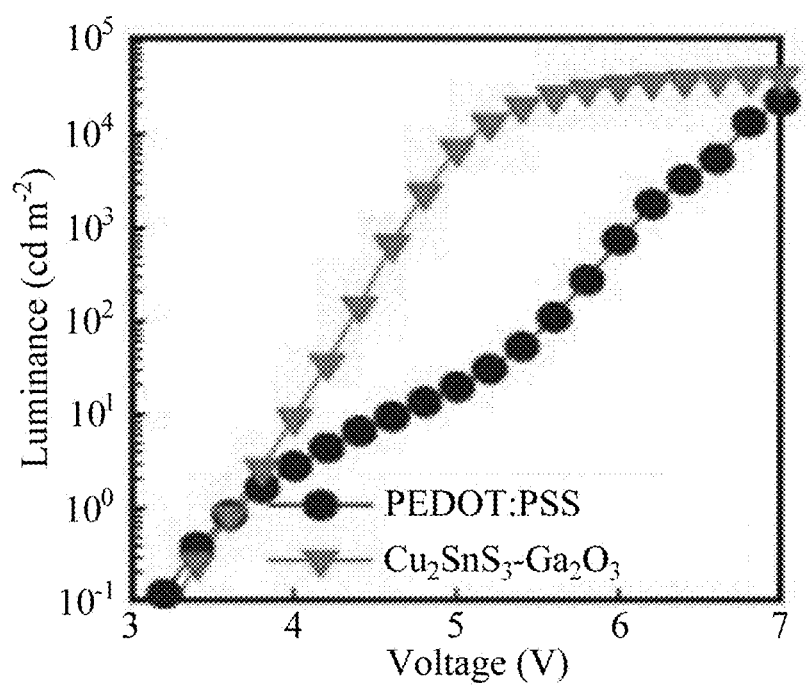
Figure 14C:
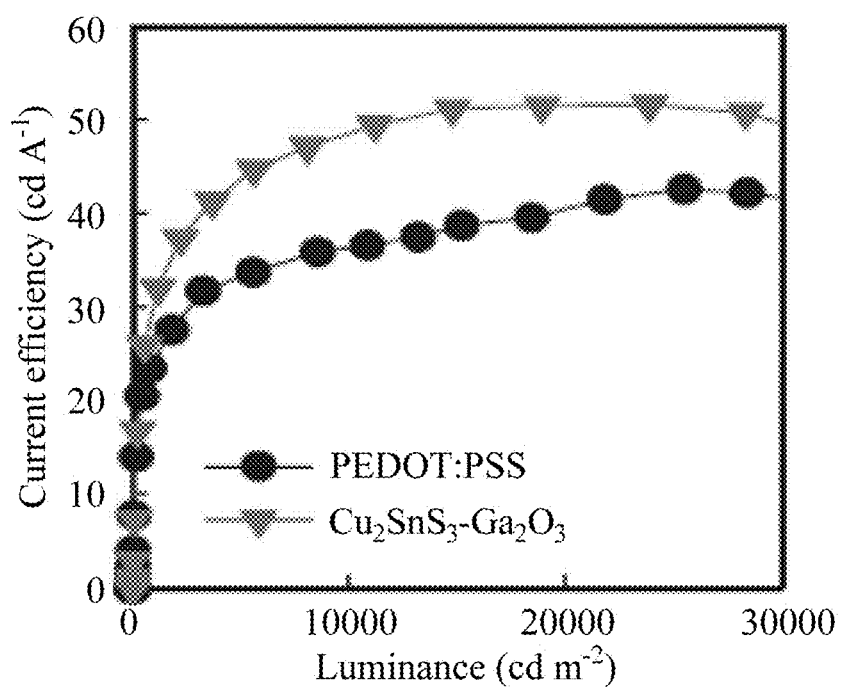

FIG. 14A shows current density-voltage (J-V) characteristics, FIG. 14B shows luminance-voltage (L-V) characteristics, and FIG. 14C shows current efficiency-luminance (C/E-L) characteristics.

Figure 14D:
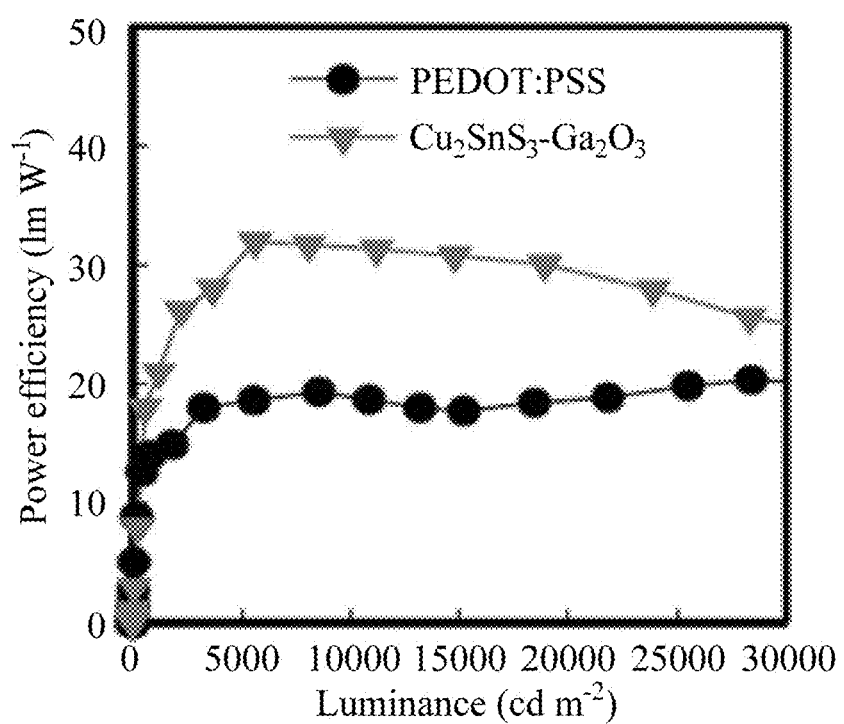
Figure 14E:
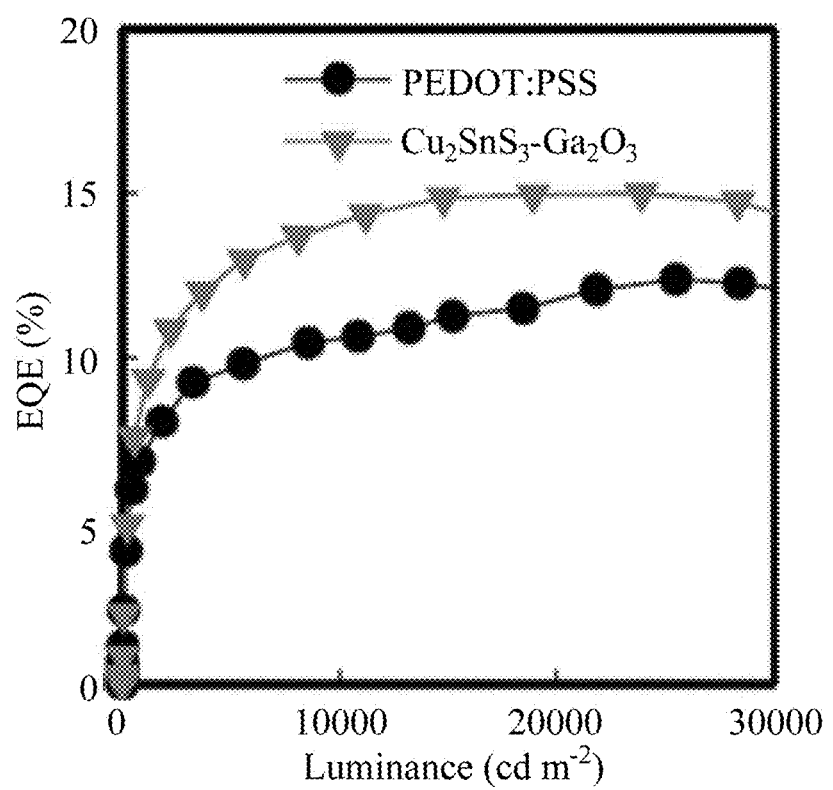

FIG. 14D shows power efficiency-luminance characteristics, and FIG. 14E shows external quantum efficiency-luminance characteristics.

In Table 4, details of the results of FIGS. 14A to 14E are shown.

TABLE 4

| Hole injection layer | Driving voltage (V) | Luminance (cd m$^{-2}$) | External quantum efficiency (%) | Current efficiency (cd A$^{-1}$) | Power efficiency (lm W$^{-1}$) |
|---|---|---|---|---|---|
| PEDOT:PSS | 6.05 | 39110 | 12.36 | 42.66 | 20.33 |
| $Cu_2SnS_3$—$Ga_2O_3$ thin film | 4.64 | 73820 | 14.93 | 51.72 | 31.97 |

Referring to FIGS. 11A to 11C, it can be seen that, as heat treatment temperature is increased to 200° C., current density is also increased, and maximum current density is exhibited when heat treatment temperature is 200° C.

Accordingly, it can be seen that, in the case of a quantum dot light-emitting diode including a $Cu_2SnS_3$—$Ga_2O_3$ thin film heat-treated at 200° C., the current density-voltage (J-V) characteristics, luminance-voltage (L-V) characteristics, current efficiency-luminance (C/E-L) characteristics, and power efficiency-luminance characteristics thereof are improved.

Figure 12A:
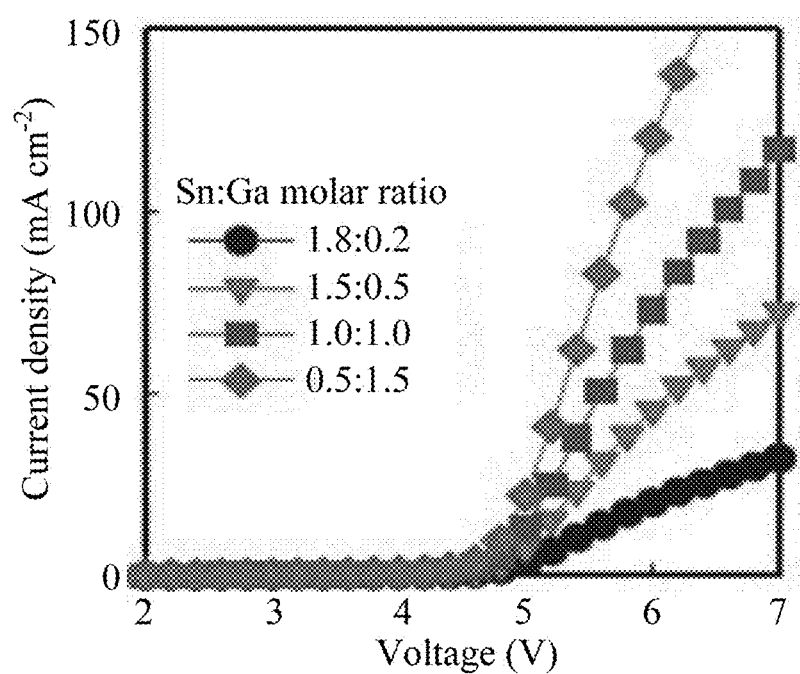
FIG. 12A is a graph showing the current density-voltage (J-V) characteristics of a quantum dot light-emitting diode including a $Cu_2SnS_3$—$Ga_2O_3$ thin film according to an embodiment of the present disclosure depending on molar ratios of Sn:Ga.
Figure 12B:
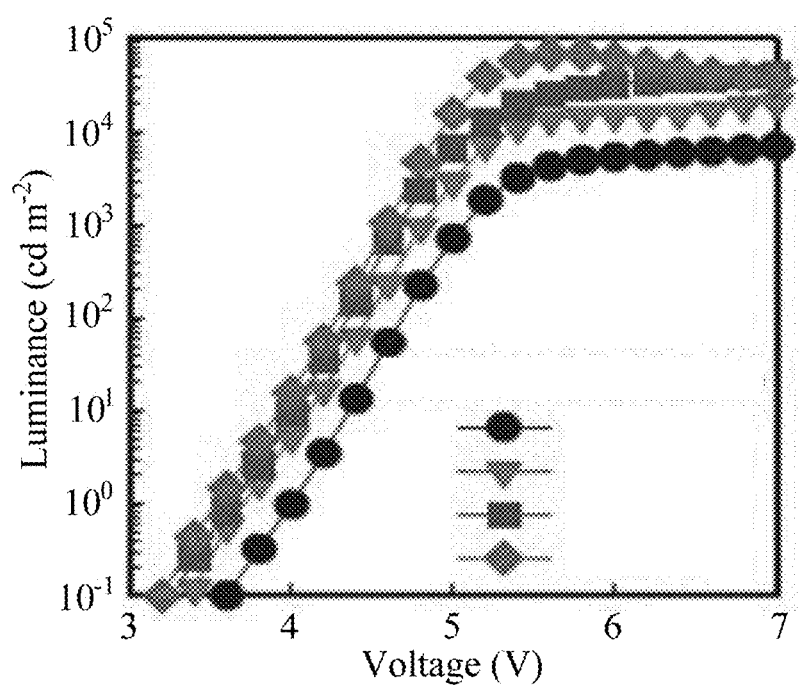
FIG. 12B is a graph showing the luminance-voltage (L-V) characteristics of the quantum dot light-emitting diode.
Figure 12C:
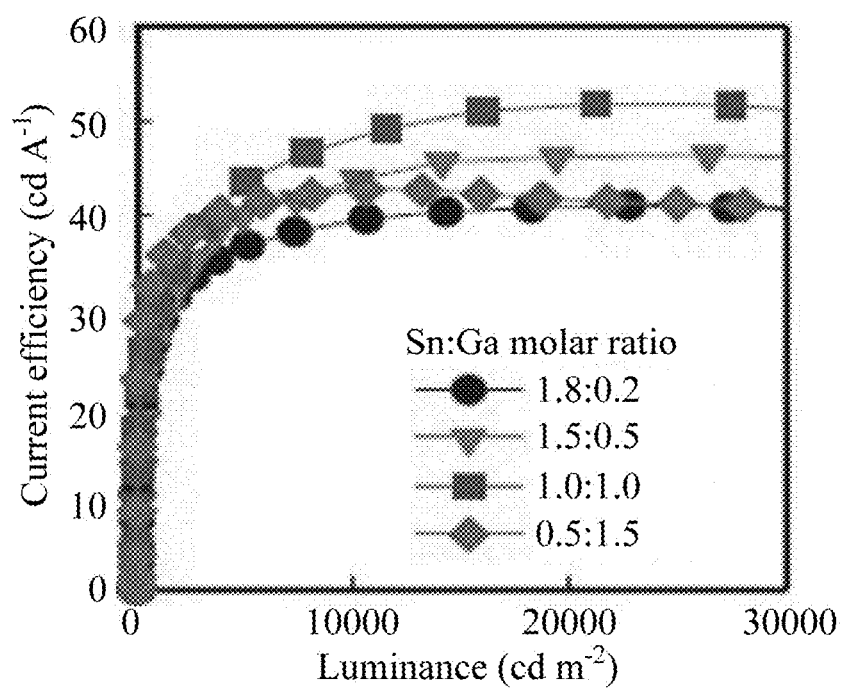
FIG. 12C is a graph showing the current efficiency-luminance (C/E-L) characteristics of the quantum dot light-emitting diode.

FIG. 12A is a graph showing the current density-voltage (J-V) characteristics of a quantum dot light-emitting diode including a $Cu_2SnS_3$—$Ga_2O_3$ thin film according to an embodiment of the present disclosure depending on molar ratios of Sn:Ga, FIG. 12B is a graph showing the luminance-voltage (L-V) characteristics of the quantum dot light-emitting diode, and FIG. 12C is a graph showing the current efficiency-luminance (C/E-L) characteristics of the quantum dot light-emitting diode.

Referring to FIGS. 12A to 12C, as the molar ratio of Ga is increased to 1.5, current density and luminance are increased. This is due to decrease in the resistivity of the $Cu_2SnS_3$—$Ga_2O_3$ thin film.

Referring to FIGS. 14A to 14E and Table 4, the quantum dot light-emitting diode including a $Cu_2SnS_3$—$Ga_2O_3$ thin film-based hole injection layer having a molar ratio of Sn to Ga (Sn:Ga) of 1:1 exhibits high current density. This data indicates that the hole injection capability of the $Cu_2SnS_3$—$Ga_2O_3$ thin film is superior to that of PEDOT:PSS.

Compared to the quantum dot light-emitting diode including a PEDOT:PSS-based hole injection layer, the quantum dot light-emitting diode including a $Cu_2SnS_3$—$Ga_2O_3$ thin film-based hole injection layer exhibits higher external quantum efficiency, current efficiency, and power efficiency, indicating that hole injection through the $Cu_2SnS_3$—$Ga_2O_3$ thin film is more efficient than PEDOT:PSS.

Figure 15A:
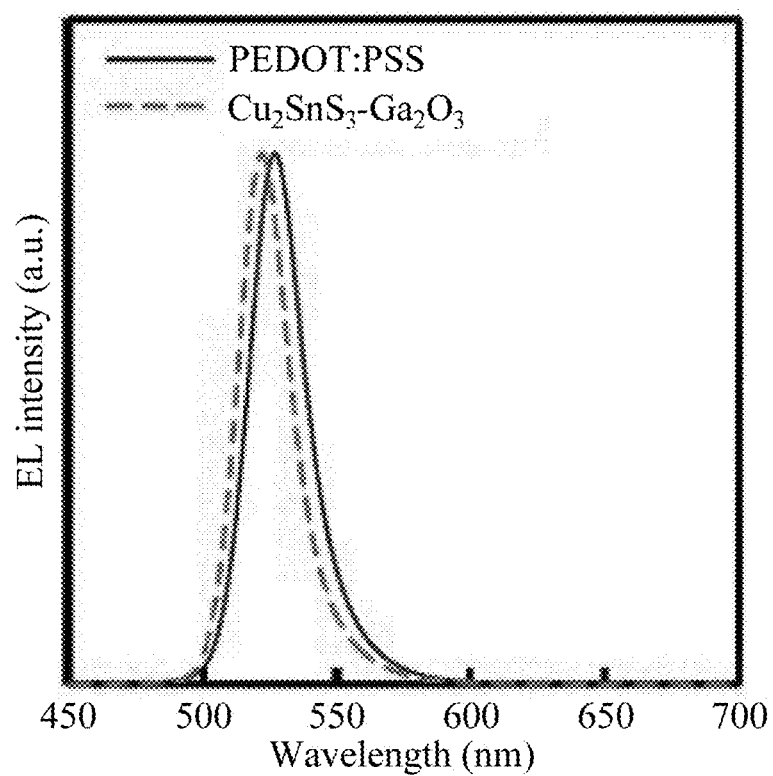
FIG. 15A is a graph showing EL intensity-current density depending on wavelength.
Figure 15B:
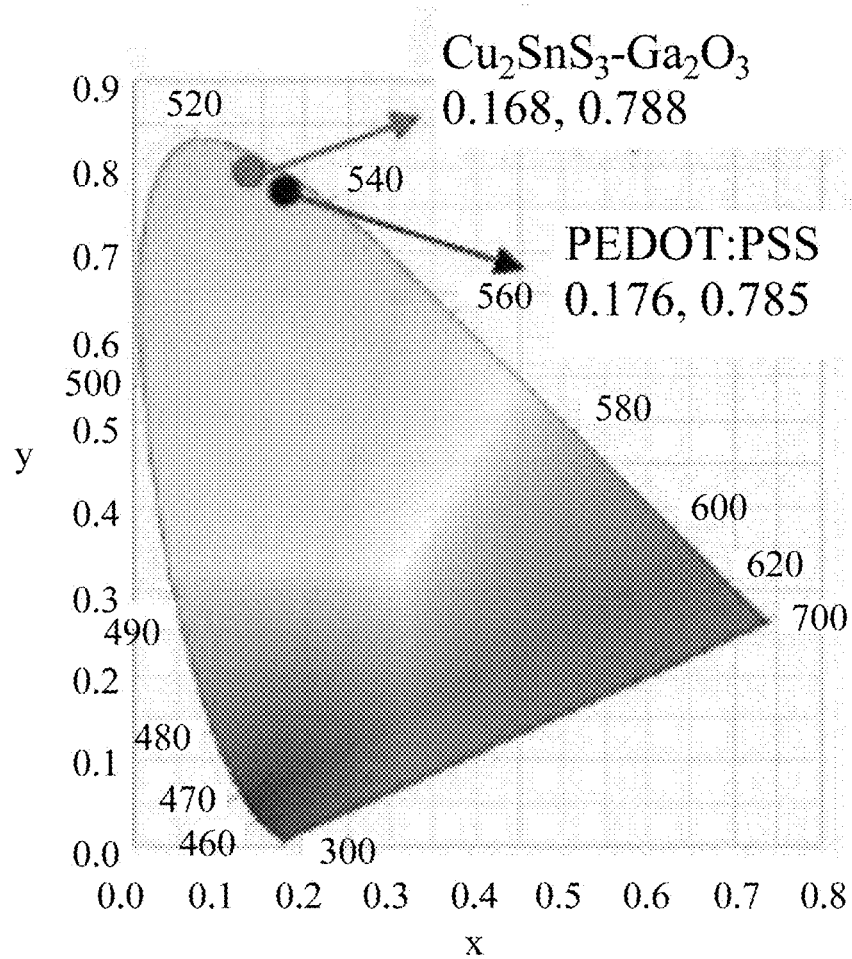
FIG. 15B shows a CIE color specification system.

FIG. 15A is a graph showing EL intensity-current density depending on wavelength, and FIG. 15B shows a CIE color specification system.

Referring to FIG. 15A, the emission peak of the quantum dot light-emitting diode including a PEDOT:PSS-based hole injection layer is 527 nm, and the emission peak of the quantum dot light-emitting diode including a $Cu_2SnS_3$—$Ga_2O_3$ thin film-based hole injection layer is 522 nm. From these results, it can be seen that pure green light having a band gap of 22 nm is emitted.

Referring to FIG. 15B, based on the color coordinates (0.168, 0.788) of the quantum dot light-emitting diode including a $Cu_2SnS_3$—$Ga_2O_3$ thin film-based hole injection layer and the color coordinates (0.176, 0.785) of the quantum dot light-emitting diode including a PEDOT:PSS-based hole injection layer, it can be seen that the quantum dot light-emitting diode including a $Cu_2SnS_3$—$Ga_2O_3$ thin film-based hole injection layer emits light with a higher color saturation than that of the quantum dot light-emitting diode including a PEDOT:PSS-based hole injection layer.

As described above, the quantum dot light-emitting diode of the present disclosure includes a $Cu_2SnS_3$—$Ga_2O_3$ thin film-based hole injection layer having high hole mobility, a high work function, and high transparency. Accordingly, the current density, luminance, external quantum efficiency, current efficiency, and power efficiency of the quantum dot light-emitting diode of the present disclosure may be improved.

In addition to the hole injection layer of a quantum dot light-emitting diode, the $Cu_2SnS_3$—$Ga_2O_3$ thin film may be used as the active layer of a transistor.

According to the embodiments of the present disclosure, by using a p-type oxide semiconductor including $Cu_2SnS_3$—$Ga_2O_3$ as a hole injection layer, a high-efficiency quantum dot light-emitting diode can be fabricated.

According to the embodiments of the present disclosure, by using a p-type oxide semiconductor fabricated using a solution process, a quantum dot light-emitting diode applicable to a low-temperature process can be fabricated, thereby reducing preparation costs.

Although the present disclosure has been described through limited examples and figures, the present disclosure is not intended to be limited to the examples. Those skilled in the art will appreciate that various modifications, additions, and substitutions are possible, without departing from the scope and spirit of the invention.

Therefore, the scope of the present disclosure should not be limited by the embodiments, but should be determined by the following claims and equivalents to the following claims.

DESCRIPTION OF SYMBOLS

100: QUANTUM DOT LIGHT-EMITTING DIODE
110: POSITIVE ELECTRODE
120: HOLE INJECTION LAYER
130: HOLE TRANSPORT LAYER
140: LIGHT-EMITTING LAYER
150: ELECTRON TRANSPORT LAYER
160: NEGATIVE ELECTRODE

What is claimed is:

1. A quantum dot light-emitting diode, comprising a positive electrode, a hole injection layer, a hole transport layer, a light-emitting layer, an electron transport layer, and a negative electrode, wherein the hole injection layer is a p-type oxide semiconductor represented by Formula 1 below:

$$Cu_2Sn_{2-X}S_3—(Ga_X)_2O_3,$$ [Formula 1]

wherein X is greater than 0.2 and less than 1.5 (0.2<x<1.5).

2. The quantum dot light-emitting diode according to claim 1, wherein the p-type oxide semiconductor is heat-treated or treated with ultraviolet light/ozone.

3. The quantum dot light-emitting diode according to claim 2, wherein the heat treatment is performed at 150 to 250° C.

4. The quantum dot light-emitting diode according to claim 2, wherein the heat treatment is performed for 10 to 90 minutes.

5. The quantum dot light-emitting diode according to claim 2, wherein the ultraviolet light/ozone treatment is performed for 0 to 5 minutes.

\* \* \* \* \*